(12) United States Patent
Endo

(10) Patent No.: US 8,630,110 B2
(45) Date of Patent: Jan. 14, 2014

(54) SEMICONDUCTOR MEMORY DEVICE

(75) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 66 days.

(21) Appl. No.: 13/459,566

(22) Filed: Apr. 30, 2012

(65) Prior Publication Data
US 2012/0281456 A1    Nov. 8, 2012

(30) Foreign Application Priority Data

May 6, 2011    (JP) ................................ 2011-103773

(51) Int. Cl.
*G11C 11/24*    (2006.01)
(52) U.S. Cl.
USPC ........................................ 365/149; 365/233.1
(58) Field of Classification Search
USPC .............................................. 365/149, 233.1
See application file for complete search history.

(56) References Cited

U.S. PATENT DOCUMENTS

| | | |
|---|---|---|
| 3,775,693 A | 11/1973 | Proebsting |
| 4,800,303 A | 1/1989 | Graham et al. |
| 5,039,883 A | 8/1991 | On |
| 5,731,856 A | 3/1998 | Kim et al. |
| 5,744,864 A | 4/1998 | Cillessen et al. |
| 5,980,092 A | 11/1999 | Merryman et al. |
| 6,049,883 A | 4/2000 | Tjandrasuwita |
| 6,078,194 A | 6/2000 | Lee |
| 6,204,695 B1 | 3/2001 | Alfke et al. |
| 6,281,710 B1 | 8/2001 | Poirier et al. |
| 6,294,274 B1 | 9/2001 | Kawazoe et al. |
| 6,479,329 B2 | 11/2002 | Nakajima et al. |
| 6,563,174 B2 | 5/2003 | Kawasaki et al. |
| 6,573,754 B2 | 6/2003 | Menczigar et al. |
| 6,727,522 B1 | 4/2004 | Kawasaki et al. |
| 6,822,478 B2 | 11/2004 | Elappuparackal |
| 7,049,190 B2 | 5/2006 | Takeda et al. |

(Continued)

FOREIGN PATENT DOCUMENTS

| | | |
|---|---|---|
| CN | 1855311 A | 11/2006 |
| EP | 1 737 044 A1 | 12/2006 |

(Continued)

OTHER PUBLICATIONS

Rhyne; "Fundamentals of Digital Systems Design"; 1973; pp. 70-71; N.J.

(Continued)

*Primary Examiner* — Hoai V Ho
(74) *Attorney, Agent, or Firm* — Fish & Richardson P.C.

(57)    ABSTRACT

The semiconductor memory device includes: a memory circuit including a transistor including an oxide semiconductor in a semiconductor layer; a capacitor for storing electric charge for reading data retained in the memory circuit; a charge storage circuit for controlling storage of electric charge in the capacitor; a data detection circuit for controlling data reading; a timing control circuit for generating a first signal controlling storage of electric charge in the capacitor (storage is conducted with the charge storage circuit, and the first signal is generated with a second signal at a supply voltage and a third signal delayed from the second signal at the supply voltage in a period immediately after the supply of the supply voltage); an inverter circuit for outputting a potential obtained by inverting a potential of one electrode of the capacitor.

17 Claims, 16 Drawing Sheets

(56) References Cited

U.S. PATENT DOCUMENTS

| | | | |
|---|---|---|---|
| 7,061,014 B2 | 6/2006 | Hosono et al. |
| 7,064,346 B2 | 6/2006 | Kawasaki et al. |
| 7,076,748 B2 | 7/2006 | Kapoor et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,582 B2 | 8/2009 | Lee et al. |
| 7,674,650 B2 | 3/2010 | Akimoto et al. |
| 7,688,107 B2 | 3/2010 | Osame et al. |
| 7,732,819 B2 | 6/2010 | Akimoto et al. |
| 2001/0013796 A1 | 8/2001 | Li et al. |
| 2001/0046027 A1 | 11/2001 | Tai et al. |
| 2002/0036529 A1 | 3/2002 | Furusawa et al. |
| 2002/0056838 A1 | 5/2002 | Ogawa |
| 2002/0132454 A1 | 9/2002 | Ohtsu et al. |
| 2003/0036529 A1 | 2/2003 | Christianson et al. |
| 2003/0129853 A1 | 7/2003 | Nakajima et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0038582 A1 | 2/2006 | Peeters |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119394 A1 | 6/2006 | Dronavalli |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0233293 A1 | 10/2006 | Osame et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024318 A1 | 2/2007 | Mamidipaka |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0161165 A1 | 7/2007 | Liu et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1* | 7/2008 | Yoshida .................. 345/100 |
| 2008/0182358 A1 | 7/2008 | Cowdery-Corvan et al. |
| 2008/0206959 A1 | 8/2008 | Takayama et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0027083 A1 | 1/2009 | Kimura et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256784 A1 | 10/2009 | Ahn |
| 2009/0278122 A1 | 11/2009 | Hosono et al. |
| 2009/0280600 A1 | 11/2009 | Hosono et al. |
| 2009/0310734 A1 | 12/2009 | Umezaki |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0124094 A1 | 5/2010 | Kimura |
| 2011/0062992 A1 | 3/2011 | Okazaki et al. |
| 2011/0064186 A1 | 3/2011 | Koyama |
| 2011/0069047 A1 | 3/2011 | Koyama et al. |
| 2011/0084731 A1 | 4/2011 | Kawae |
| 2011/0089975 A1 | 4/2011 | Yamazaki et al. |
| 2011/0090184 A1 | 4/2011 | Yamazaki et al. |
| 2011/0101332 A1 | 5/2011 | Yamazaki et al. |
| 2011/0102018 A1 | 5/2011 | Shionoiri et al. |
| 2011/0121878 A1 | 5/2011 | Kato et al. |
| 2011/0156027 A1 | 6/2011 | Yamazaki et al. |
| 2011/0285372 A1 | 11/2011 | Takahashi et al. |
| 2011/0285426 A1 | 11/2011 | Takahashi et al. |
| 2011/0285442 A1 | 11/2011 | Saito |
| 2012/0032785 A1 | 2/2012 | Kamata |
| 2012/0057396 A1 | 3/2012 | Yamazaki et al. |
| 2012/0155150 A1 | 6/2012 | Nagatsuka et al. |
| 2012/0170355 A1 | 7/2012 | Ohmaru et al. |
| 2012/0212995 A1 | 8/2012 | Kurokawa |
| 2012/0268164 A1 | 10/2012 | Kobayashi et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-323987 A | 11/2006 |
| JP | 2010-124290 A | 6/2010 |

(56) References Cited

FOREIGN PATENT DOCUMENTS

| | | |
|---|---|---|
| JP | 2011-086363 A | 4/2011 |
| WO | 2004/114391 A1 | 12/2004 |
| WO | 2011/033909 A1 | 3/2011 |

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9, Agne Gijutsu Center (with English translation).

International Search Report, PCT Application No. PCT/JP2012/061631, dated Jun. 12, 2012, 2 pages.

Written Opinion, PCT Application No. PCT/JP2012/061631, dated Jun. 12, 2012, 3 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (Zno TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of Am-Oled," IDW '06 : Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on their way to business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, 581-584.

Nakamura, "Synthesis of Homolgous Compound with New Long-Period Structure," Nirim Newsletter, Mar. 1995, vol. 150, pp. 1-4 with English translation.

Nakamura, M et al., "The Phase relations in the $In_2O_3$-$Ga_2ZnO_4$-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Appied Physics Letters), Sep. 13, 2004, vol. 85, No. 11, pp. 1993-1995.

Nowatari, H et al., "60.2: Intermediate Connector with Suppressed Voltage loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 :SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 227-230.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvement in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Radio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown Zno TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDS," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

● In
☾ Sn
☽ Zn
• O

● In
○ Ga
○ Zn
● O

SEMICONDUCTOR MEMORY DEVICE

TECHNICAL FIELD

The present invention relates to a semiconductor memory device, particularly to a semiconductor memory device in a signal processing unit, in which the logic state is not erased after the power is turned off.

BACKGROUND ART

Signal processing units such as central processing units (CPUs) vary in structure depending on the intended use. A signal processing unit generally has a main memory for storing data or program and other memory devices such as a register and a cache memory. A register has a function of temporarily holding a data signal for carrying out arithmetic processing, holding a program execution state, or the like. Meanwhile, a cache memory, which is located between an arithmetic device and a main memory, is provided to reduce access to the main memory and speed up the arithmetic processing.

In a memory device in a signal processing unit, such as a register or a cache memory, input of a data signal needs to be performed at higher speed than in a main memory. For this reason, in general, a flip-flop, a static random access memory (SRAM) or the like is used as a register or a cache memory. In other words, such a register, a cache memory, or the like is a volatile memory device which loses a data signal after the supply of the supply voltage is stopped.

In order to achieve low power consumption, a method in which the supply of the supply voltage to a signal processing unit is temporarily stopped while input/output of data signal is not conducted has been suggested (see Patent Document 1, for example). In the method in Patent Document 1, a nonvolatile memory device is located in the periphery of a volatile memory device, and the data is temporarily stored in the nonvolatile memory device.

REFERENCE

[Patent Document]
[Patent Document 1] Japanese Published Patent Application No. 2010-124290

DISCLOSURE OF INVENTION

In the structure described in Patent Document 1, data in a volatile storage device can be transported to and stored in a nonvolatile storage device located in the periphery of the volatile storage device while the supply of the supply voltage is stopped in a signal processing unit.

However, the volatile memory device and the nonvolatile memory device are separately operated, which requires separate control signals for writing data to the nonvolatile memory device and reading data from the nonvolatile memory device before the supply of the supply voltage is stopped and after the supply of the supply voltage is restarted. This creates the need for generation of control signals for writing data to the nonvolatile memory device and reading data from the nonvolatile memory device and the need for wiring for supplying these signals.

In view of the above-described problem, it is an object of one embodiment of the present invention to provide a semiconductor memory device in which the supply of the supply voltage is stopped and restarted and which is configured such that the number of signals for controlling the semiconductor memory device supplied from an external circuit is reduced.

One embodiment of the present invention is a nonvolatile semiconductor memory device in which a volatile memory unit and a nonvolatile memory unit are not separately operated. Specifically, the semiconductor memory device includes: a memory circuit including a transistor including an oxide semiconductor in a semiconductor layer; a capacitor for storing electric charge for reading data retained in the memory circuit; a charge storage circuit for controlling storage of electric charge in the capacitor; a data detection circuit for controlling data reading; a timing control circuit for generating a first signal controlling storage of electric charge in the capacitor (storage is conducted with the charge storage circuit, and the first signal is generated with a second signal at a supply voltage and a third signal delayed from the second signal at the supply voltage in a period immediately after the supply of the supply voltage); an inverter circuit for outputting a potential obtained by inverting a potential of one electrode of the capacitor. The semiconductor memory unit can be restarted with data stored even after the supply of the supply potential is stopped and restarted by data and a clock signal.

One embodiment of the present invention is a semiconductor memory device including a memory circuit, a second capacitor, a charge storage circuit, a data detection circuit, a timing control circuit, and an inverter circuit. The memory circuit includes: a first transistor having a first terminal electrically connected to a data input line, a gate electrically connected to a clock signal line, and an oxide semiconductor in a semiconductor layer; a first capacitor one electrode of which is electrically connected to a second terminal of the first transistor; and a second transistor having a gate electrically connected to the second terminal of the first transistor and to the one electrode of the first capacitor. The second capacitor is configured to store electric charge for reading data retained in the memory circuit. The charge storage circuit is electrically connected to a supply potential line and configured to control storage of electric charge in the second capacitor. The data detection circuit configured to control conduction or non-conduction between one electrode of the second capacitor and a first terminal of the second transistor. The timing control circuit is configured to cause the charge storage circuit and the data detection circuit to be alternately brought into a conductive state in accordance with toggling of the clock signal in a first period in which a clock signal is supplied to the clock signal line, and to generate a first signal that controls storage of electric charge in the second capacitor in the charge storage circuit. The first signal is generated with a second signal at a supply voltage and a third signal delayed from the second signal at the supply voltage in a second period immediately after the supply voltage is supplied to the supply potential line. The inverter circuit is configured to output a potential obtained by inverting a potential of one electrode of the second capacitor.

One embodiment of the present invention is a semiconductor memory device including a memory circuit, a second capacitor, a charge storage circuit, a data detection circuit, a timing control circuit, and an inverter circuit. The memory circuit includes: a first transistor having a first terminal electrically connected to a data input line, a gate electrically connected to a clock signal line, and an oxide semiconductor in a semiconductor layer; a first capacitor one electrode of which is electrically connected to a second terminal of the first transistor; and a second transistor having a gate electrically connected to the second terminal of the first transistor and to the one electrode of the first capacitor. The second capacitor is configured to store electric charge for reading data retained in the memory circuit. The charge storage circuit includes a third transistor having a first terminal electrically connected to a supply potential line and a second terminal electrically connected to one electrode of the second capacitor. The data detection circuit includes a fourth transistor having a first terminal electrically connected to the one electrode of the second capacitor and a second terminal electrically connected to a first terminal of the second transistor. The timing control circuit is configured to cause the third transistor and the fourth transistor to be alternately brought into a conductive state in accordance with toggling of the clock signal in a first period in which a clock signal is supplied to the clock signal line, and to generate a first signal for bringing the third transistor into a conductive state. The first signal is generated with a second signal at a supply voltage and a third signal delayed from the second signal at the supply voltage in a second period immediately after the supply voltage is supplied to the supply potential line. The inverter circuit is configured to output a potential obtained by inverting a potential of one electrode of the second capacitor.

According to one embodiment of the present invention, it is preferable that the second transistor include silicon in a semiconductor layer.

According to one embodiment of the present invention, it is preferable that the first transistor and the second transistor form a layered structure.

According to one embodiment of the present invention, it is preferable that the data detection circuit be a circuit configured to convert a potential of the one electrode of the second capacitor into an inverted data signal having inverted data in accordance with discharge and non-discharge of the electric charge stored in the second capacitor, and the discharge and non-discharge be determined by a conducting state of the second transistor.

According to one embodiment of the present invention, it is preferable that a circuit for delaying the signal at the supply potential include a delay circuit and a buffer circuit.

According to one embodiment of the present invention, it is preferable that the timing control circuit include a non-conjunction circuit receiving a signal at the supply potential and a signal delayed from the signal at the supply potential, and a disjunction circuit receiving an output signal of the non-conjunction circuit and the clock signal.

According to one embodiment of the present invention, in the structure in which the supply of the supply voltage is stopped and restarted, data can be stored and output with a clock signal. In addition, data can be retained while the supply of the supply voltage is stopped without supplying another control signal from an external circuit, reducing the number of signals for controlling the semiconductor memory device.

BEST MODE FOR CARRYING OUT THE INVENTION

Figure 1A:
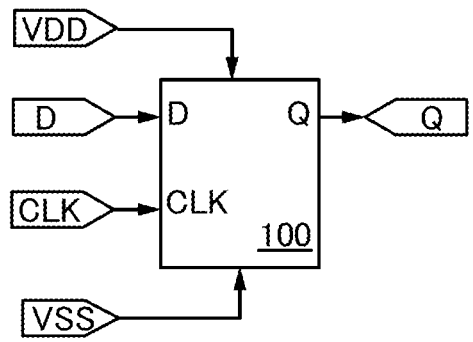
FIGS. 1A and 1B are circuit diagrams of a semiconductor memory device.

Embodiments of the present invention will be described below with reference to the drawings. Note that the structures of the present invention can be implemented in various different ways. It will be readily appreciated by those skilled in the art that modes and details of the embodiments can be modified in various ways without departing from the spirit and scope of the present invention. The present invention therefore should not be construed as being limited to the description of the embodiments. Note that in the structures of the present invention described below, reference numerals denoting the same portions are used in common in different drawings.

Note that, the size, layer thickness, signal waveform, and region of each object illustrated in the drawings and the like of the embodiments are exaggerated for simplicity in some cases. Therefore, each object is not necessarily in such scales.

Note that the description that explicitly states "A and B are connected to each other" is intended for the case where A and B are electrically connected to each other; the case where A and B are functionally connected to each other; the case where A and B are directly connected to each other; and the like.

Note that, in this specification, the terms "first", "second", "third", to "N (N is a natural number)" are used only for preventing confusion between components, and thus do not limit numbers.

Embodiment 1

A signal processing unit includes a semiconductor memory device. The signal processing unit can store a signal having one-bit or multi-bit data with one or more semiconductor memory devices. This embodiment describes the configuration of the semiconductor memory device in the signal processing unit.

Note that examples of the signal processing unit include large scale integrated circuits (LSIs) such as CPUs, microprocessors, image processing circuits, digital signal processors (DSPs), and field programmable gate arrays (FPGAs).

FIG. 1A is an example of a block diagram of a semiconductor memory device. A semiconductor memory device 100 according to this embodiment illustrated in FIG. 1A is a circuit that can retain and output data D input thereto by using toggling of a clock signal CLK. In the structure according to this embodiment, data D is stored when the clock signal is set to an H level (the level of a high supply potential VDD), and the stored data D is output as an output signal Q when the clock signal is set to an L level (the level of a low supply potential VSS). Further, with the structure according to this embodiment, the stored data D can be retained in the semiconductor memory device even if the supply voltage (the high supply potential VDD and the low supply potential VSS (GND)) is stopped during data retention. The operation can restart from output of the retained data D when the supply of the supply voltage is restarted.

Note that in this specification, "the supply of a signal or supply voltage is stopped" refers to "a signal or supply voltage is not supplied to wiring for supplying a signal or supply voltage". In addition, in this specification, "the supply of a signal or supply voltage is restarted" refers to "the supply of a signal or supply voltage to wiring for supplying a signal or supply voltage is restarted after the supply of the signal or supply voltage is stopped". Note that in this specification, "a signal is fixed" refers, for example, to "an AC signal oscillated with a predetermined frequency is converted into a DC signal having a fixed potential such as a high supply potential VDD or a low supply potential VSS".

Figure 1B:
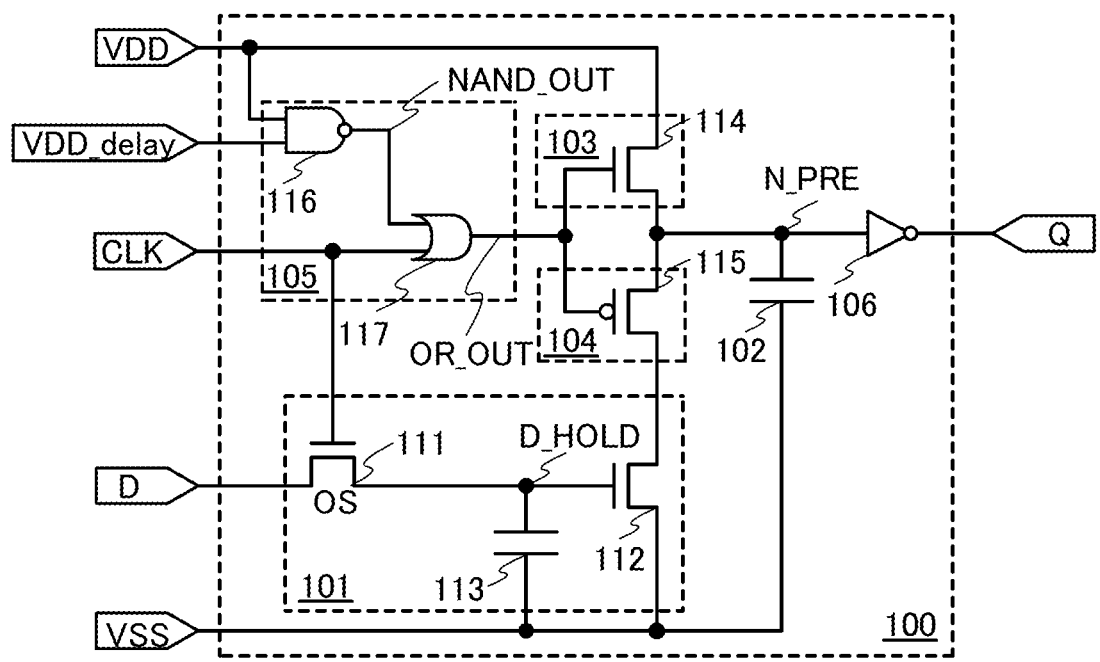

Next, a specific circuit configuration of the semiconductor memory device 100 is illustrated in FIG. 1B. The semiconductor memory device 100 in FIG. 1B includes a memory circuit 101 including a first capacitor 113; a second capacitor 102; a charge storage circuit 103 (also called precharge circuit); a data detection circuit 104; a timing control circuit 105; and an inverter circuit 106.

FIG. 1B illustrates signals input and output to/from the semiconductor memory device 100. Referring to FIG. 1B, a first supply potential line VDD for supplying the high supply potential VDD, a second supply potential line VSS for supplying the low supply potential VSS, a data input line D for supplying the data D, a clock signal line CLK for supplying the clock signal CLK, and an output signal line Q for outputting the output signal Q are provided. Referring to FIG. 1B, a delay high supply potential line VDD_delay for supplying a signal VDD_delay obtained by delaying a rise in a potential based on the high supply potential VDD at the restart of the supply of the high supply potential VDD is provided.

The memory circuit 101 in FIG. 1B includes a first transistor 111, a second transistor 112, and the first capacitor 113. One of a source and a drain of the first transistor 111 (a first terminal) is connected to the data signal line D. The other of the source and the drain of the first transistor 111 (a second terminal) is connected to a gate of the second transistor 112 and one electrode of the first capacitor 113. A gate of the first transistor 111 is connected to the clock signal line CLK. The other electrode of the first capacitor 113 is connected to the second supply potential line VSS. Note that a node connected to the first transistor 111, the second transistor 112, and the first capacitor 113 is hereinafter called "memory node D_HOLD".

The first transistor 111 stores the data D in the memory node D_HOLD in accordance with toggling of the clock signal CLK supplied to the gate. For example, if the first transistor 111 is an n-channel transistor, the first transistor 111 is brought into a conductive state when the clock signal CLK is at an H level, so that the data D is stored in the memory node D_HOLD. When the clock signal CLK is at an L level, the first transistor 111 is brought into a nonconductive state, so that the data D stored immediately before the first transistor 111 is brought into a nonconductive state is retained in the memory node D_HOLD.

The first transistor 111 in FIG. 1B is a transistor whose channel is formed in an oxide semiconductor layer. Note that the first transistor 111 is represented by OS in the figure so that it is recognized as being a transistor whose channel is formed in an oxide semiconductor layer.

An oxide semiconductor includes at least one or more elements selected from In, Ga, Sn, and Zn. For example, an oxide of four-component metal elements, such as an In—Sn—Ga—Zn—O-based oxide semiconductor; an oxide of three-component metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two-component metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or an oxide of one-component metal element, such as an In—O-based oxide semiconductor, a Sn—O-based oxide semiconductor, or a Zn—O-based oxide semiconductor can be used. In addition, any of the above oxide semiconductors may contain an element other than In, Ga, Sn, and Zn, for example, $SiO_2$.

For example, an In—Ga—Zn—O-based oxide semiconductor refers to an oxide semiconductor containing indium (In), gallium (Ga), and zinc (Zn), and there is no limitation on the composition ratio thereof.

As the oxide semiconductor, a thin film represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for deposition of an In—Zn—O-based oxide semiconductor has a composition ratio of In:Zn:O=X:Y:Z in an atomic ratio, Z>1.5X+Y.

In a transistor whose channel is formed in an oxide semiconductor layer which is highly purified by drastic removal of hydrogen contained in the oxide semiconductor layer, the off-state current density can be 100 zA/μm or less, preferably 10 zA/μm or less, more preferably 1 zA/μm or less. Thus, the off-state current of the transistor is extremely lower than that of the transistor containing silicon with crystallinity. As a result, while the first transistor 111 is in the nonconductive state, the potential of the memory node D_HOLD, that is, the potential of the gate of the second transistor 112 can be retained for a long period of time.

Note that in this specification, the off-state current is a current that flows between a source and a drain when a transistor is in the nonconductive state. In the case of an n-channel transistor (whose threshold voltage is, for example, about 0 to 2 V), off-state current refers to current flowing between the source and the drain when negative voltage is applied between the gate and the source.

A material which can achieve off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. A MEMS switch, for example, may be used instead of a transistor to break connection between wirings, which achieves long-time retention of charge in the memory node D_HOLD.

The second transistor 112 in FIG. 1B is an element serving as a switch. FIG. 1B illustrates the case where a transistor of one conductivity type (e.g., an n-channel transistor) is used as the second transistor 122. Here, in a switch, one terminal of the switch corresponds to one of a source and a drain of a transistor, while the other terminal of the switch corresponds to the other one of the source and the drain of the transistor. Further, the conductive state and the nonconductive state of the switch are selected by a potential based on the data D retained at a gate of the transistor. If the second transistor 112, which is an n-channel transistor, functions as a switch, the second transistor 112 is brought into the conductive state (ON state) by an H level, and is brought into the nonconductive state (OFF state) by an L level.

In FIG. 1B, the second transistor 112 can be a transistor whose channel is formed in a layer or substrate of a semiconductor other than an oxide semiconductor, e.g., a transistor whose channel is formed in a silicon layer or a silicon substrate.

The first capacitor 113 can be omitted by utilizing, for example, the capacitance between the gate of the second transistor 112 and the one of the source and the drain of the first transistor 111.

Discharge and non-discharge of electric charge stored in one electrode of the second capacitor 102 in FIG. 1B are selected in accordance with the data D. A potential corresponding to the electric charge that changes in accordance with its discharge and non-discharge is output as the output signal Q through the inverter circuit 106. Therefore, the second capacitor can be set in a first state where electric charge is stored therein and a second state where discharge of electric charge is selected in accordance with the data D retained in the memory node D_HOLD in the memory circuit 101. Note that the node of one electrode of the second capacitor 102 is hereinafter called "storage node N_PRE".

The charge storage circuit 103 in FIG. 1B is a circuit for setting the second capacitor 102 in the first state by causing electric charge to be stored in the storage node N_PRE of the second capacitor 102. The charge storage circuit 103 includes a third transistor 114 which is an n-channel transistor. A first terminal of the third transistor 114 is connected to the first supply potential line VDD for supplying the high supply potential VDD. A second terminal of the third transistor 114 is connected to one electrode of the second capacitor. A gate of the third transistor 114 is connected to the timing control circuit 105. The conductive state and the nonconductive state of the third transistor 114 are controlled in accordance with a signal from the timing control circuit 105.

The data detection circuit 104 in FIG. 1B controls conduction or non-conduction between the storage node N_PRE of the second capacitor 102 and the first terminal of the second transistor 112 in the memory circuit 101. The data detection circuit 104 includes a fourth transistor 115 which is a p-channel transistor. A first terminal of the fourth transistor 115 is connected to one electrode of the second capacitor 102. A second terminal of the fourth transistor 115 is connected to the first terminal of the second transistor 112. A gate of the fourth transistor 115 is connected to the timing control circuit 105. The conductive state and the nonconductive state of the fourth transistor 115 are controlled in accordance with a signal from the timing control circuit 105.

The timing control circuit 105 in FIG. 1B is a circuit for causing, in a period in which the clock signal CLK is supplied to the clock signal line CLK (also called a first period), the charge storage circuit 103 and the data detection circuit 104 to be alternately brought into the conductive state in accordance with toggling of the clock signal CLK. The timing control circuit 105 in FIG. 1B is a circuit for generating, in a period immediately after the high supply potential VDD is supplied to the first supply potential line VDD (also called a second period), a signal that controls storage of electric charge in the storage node N_PRE of the second capacitor which is conducted with the charge storage circuit 103. This signal is generated with a timing signal generated from a signal at the high supply potential VDD and from the signal VDD_delay which is delayed from the signal at the high supply potential VDD.

Note that the conductivity types of the third transistor 114 in the charge storage circuit 103 and the fourth transistor 115 in the data detection circuit 104 are set so that these transistors are alternately brought into the conductive state. The third transistor 114 is an n-channel transistor so that it can be brought into the conductive state by a timing signal generated from a signal at the high supply potential VDD and the signal VDD_delay which is delayed from the signal at the high supply potential VDD.

Figure 2:
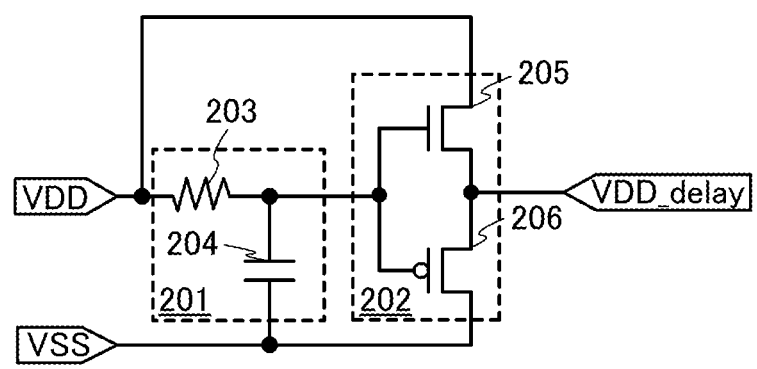
FIG. 2 is a circuit diagram for describing the semiconductor memory device.

Note that an example of a circuit for delaying a signal at the high supply potential VDD is illustrated in FIG. 2. A circuit in FIG. 2 includes a delay circuit unit 201 and a buffer circuit unit 202. The delay circuit unit 201 may be composed of an RC delay circuit including a resistor 203 and a capacitor 204. The buffer circuit unit 202 may have an n-channel transistor 205 connected to wiring supplied with the high supply potential VDD, and a p-channel transistor 206 connected to wiring supplied with the low supply potential VSS. Thus, a signal delay generated in the delay circuit unit 201 can be reflected in the timing of transition of the input to the buffer circuit unit 202 from an L level to an H level.

A specific example of the circuit configuration of the timing control circuit 105 will be described with reference to FIG. 1B. In FIG. 1B, the timing control circuit 105 includes a NAND circuit 116 (non-conjunction circuit) and an OR circuit 117 (disjunction circuit). The NAND circuit 116 receives a signal at the high supply potential VDD and the signal VDD_delay delayed from the signal at the high supply potential VDD and outputs a NAND circuit output signal (NAND_OUT). The OR circuit 117 receives the NAND circuit output signal (NAND_OUT) and the clock signal CLK and outputs an OR circuit output signal (OR_OUT).

The inverter circuit 106 in FIG. 1B is a circuit that inverts a signal at the storage node N_PRE of the second capacitor 102 and outputs an inverted signal as the output signal Q. The inverter circuit 106 may have a circuit configuration in which, for example, a p-channel transistor and an n-channel transistor are used in combination.

Figure 3:
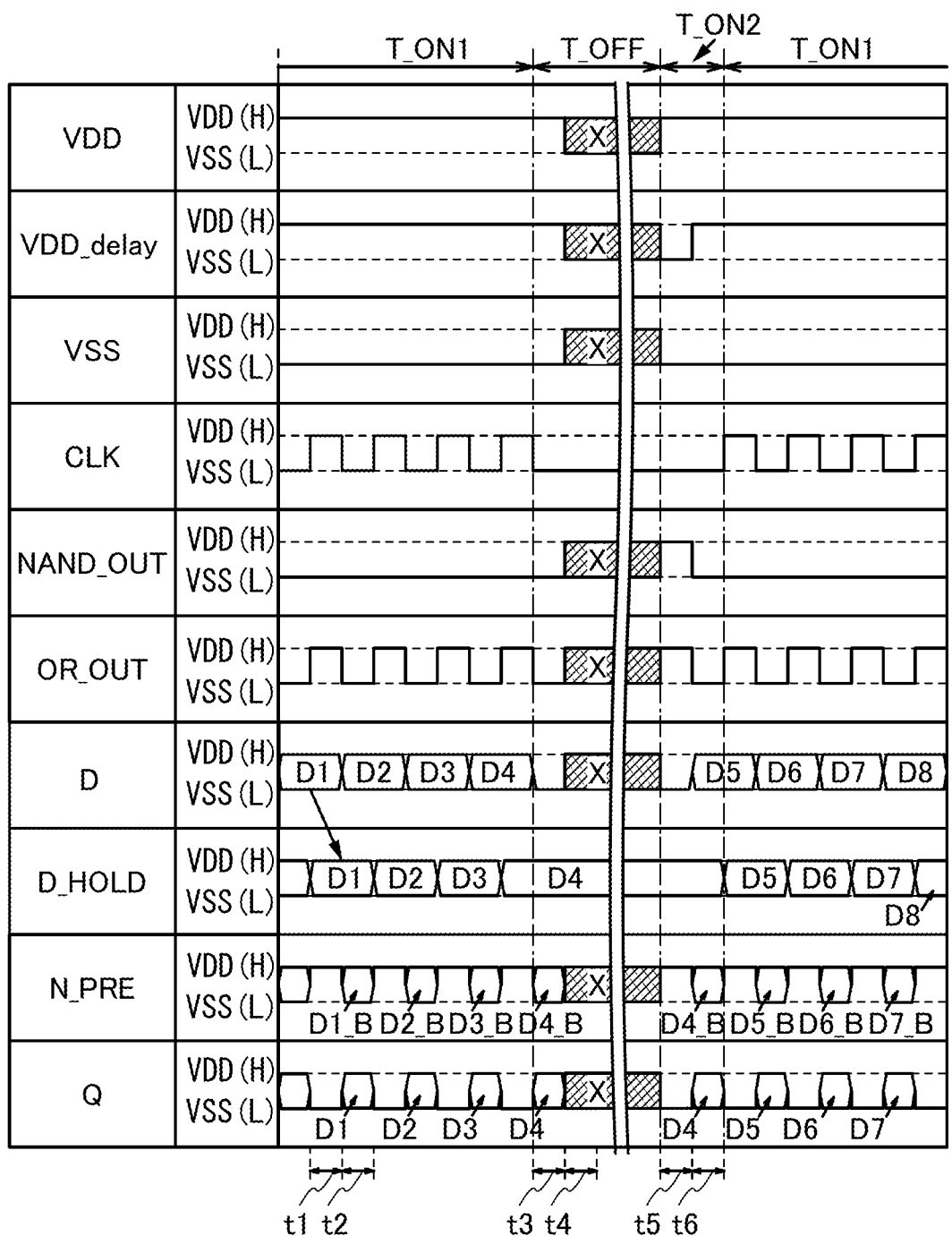
FIG. 3 is a timing chart of the semiconductor memory device.

Next, a description is given of the operation of the semiconductor memory device 100 having a configuration according to this embodiment during an operation in which retention and output of the data D are repeated and in the case where the supply of supply potential is stopped and restarted. FIG. 3 is a timing chart of the semiconductor memory device in FIG. 1B. The operation is described with reference to the timing chart. In the timing chart of FIG. 3, VDD, VDD_delay, VSS, NAND_OUT, OR_OUT, D_HOLD, N_PRE, and Q correspond to the potentials of the input and output signals and nodes in FIG. 1B. The timing chart of FIG. 3 shows a plurality of periods (periods t1 to t6), which will be described with reference to FIGS. 4A and 4B, FIGS. 5A and 5B, and FIGS.

6A and 6B, for description of a plurality of possible states of the semiconductor memory device 100.

Note that in a description given with reference to FIG. 3, FIGS. 4A and 4B, FIGS. 5A and 5B, and FIGS. 6A and 6B, the data D is represented by D1 to DN (N is a natural number). This is for explaining when the data D in the semiconductor memory device 100 is output. A signal at the storage node N_PRE, which is the inverted signal of the data D1 to DN, is shown as inverted data D1_B to DN_B. Note that the inverted signal of the inverted data D1_B to DN_B is the data D1 to DN.

In the description of the operation in FIG. 3 below, the transistors have the same conductivity types as the respective transistors illustrated in FIG. 1B, and the logic circuits have the same configurations as the respective logic circuits in FIG. 1B. This does not necessarily apply to the operation described below; the conductivity of each transistor, a combination of logic circuits, and the potential of each control signal can be determined as appropriate as long as the conducting state of each transistor is the same as in FIG. 3. Each signal can be represented by an H level (high supply potential VDD) and an L level (low supply potential VSS).

First, a description is given of the operation during a first operation period T_ON1 (illustrated in FIG. 3) in which retention and output of the data D are repeated is described. The first operation period T_ON1 can be divided into a period in which the data D1 from the data input line D is stored in the memory node D_HOLD and the clock signal CLK is set to an H level by toggling of the clock signal CLK (in FIG. 3, the period t1), and a period in which the data D1 stored in the memory node D_HOLD in the period t1 is retained and this data D1 is output to the output signal line as the output signal Q (in FIG. 3, the period t2).

Figure 4A:
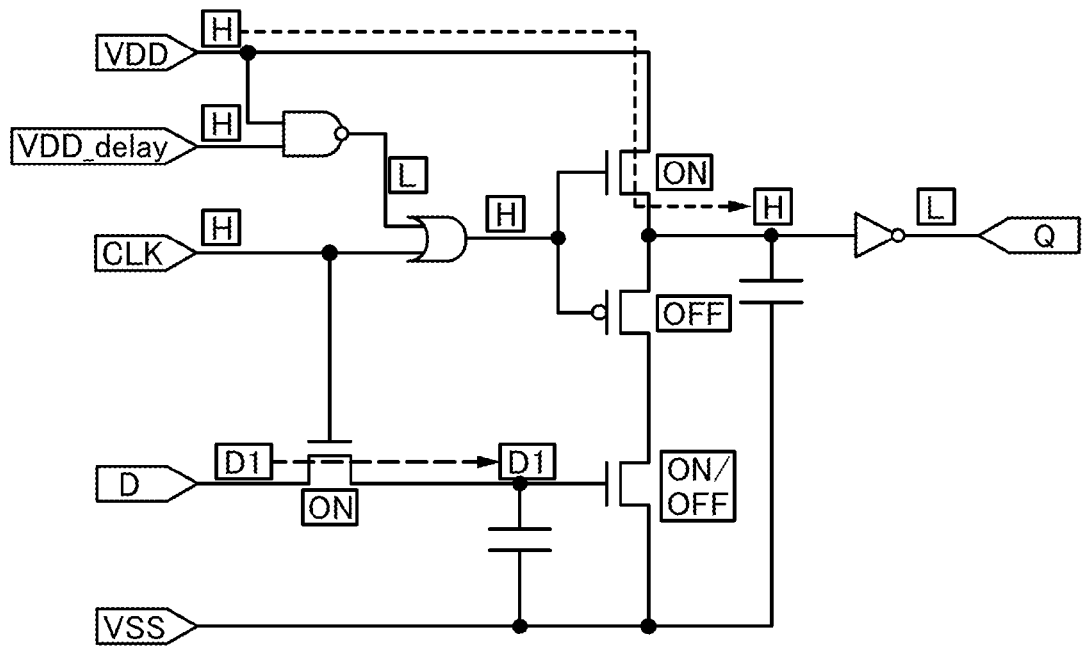
FIGS. 4A and 4B are diagrams for describing operation of the semiconductor memory device.

FIG. 4A is a diagram illustrating possible conducting states of the transistors in the semiconductor memory device 100 and current flow represented by dotted arrows in the period t1 in the first operation period T_ON1.

In the period t1, the clock signal CLK is at an H level and the first transistor 111 in the memory circuit 101 is in the conductive state. Consequently, the data D1 is supplied from the data input line D to the memory node D_HOLD. At this time, the conducting state of the second transistor 112 depends on the logic state of the data D1, and is represented by "ON/OFF" in the figure.

Further, in the period t1, the first supply potential line VDD and the delay supply potential line VDD_delay are at an H level. Consequently, NAND_OUT is at an L level, while OR_OUT is at an H level. Since OR_OUT is at an H level, the third transistor 114 in the charge storage circuit 103 is brought into the conductive state and the fourth transistor 115 in the data detection circuit 104 is brought into the nonconductive state. As a result, the potential of the storage node N_PRE is increased to an H level by charge storage performed with the charge storage circuit 103. The output signal output via the inverter circuit 106 is at an L level.

Figure 4B:
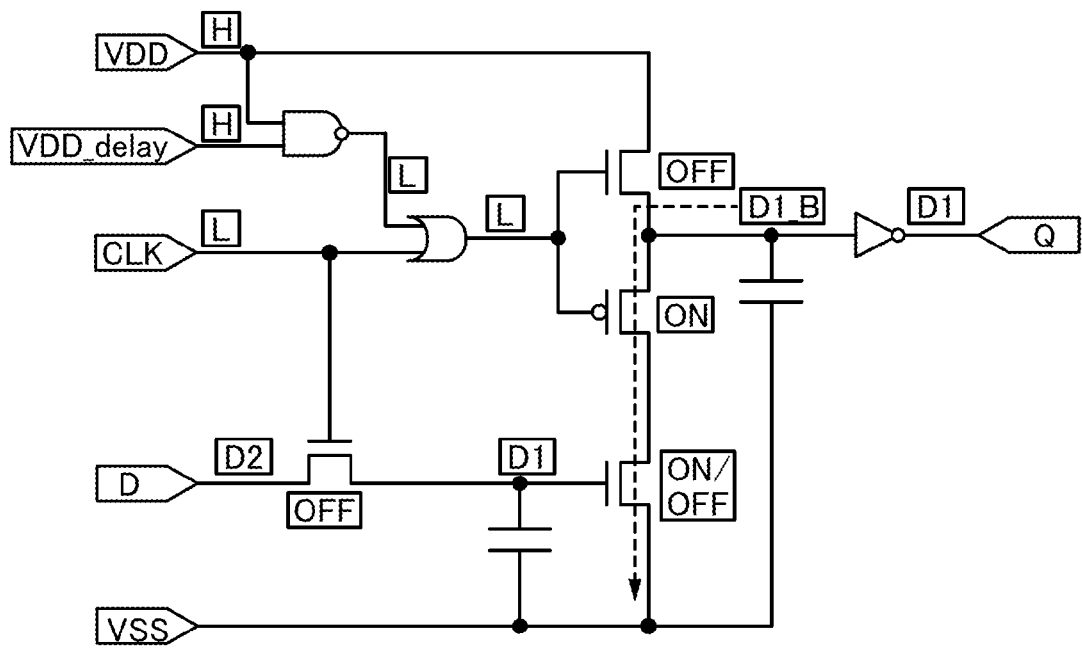

FIG. 4B is a diagram illustrating possible conducting states of the transistors in the semiconductor memory device 100 and current flow represented by dotted arrows in the period t2 in the first operation period T_ON1.

In the period t2, the clock signal CLK is at an L level and the first transistor 111 in the memory circuit 101 is in the nonconductive state. Consequently, even if the data input line D has the data D2, the data D1 written in the previous period is retained in the memory node D_HOLD. At this time, the conducting state of the second transistor 112 depends on the logic state of the data D1, and is represented by "ON/OFF" in the figure.

Further, in the period t2, the first supply potential line VDD and the delay supply potential line VDD_delay are at an H level. Consequently, NAND_OUT is at an L level, while OR_OUT is at an L level. Since OR_OUT is at an L level, the third transistor 114 in the charge storage circuit 103 is brought into the nonconductive state and the fourth transistor 115 in the data detection circuit 104 is brought into the conductive state. As a result, the potential of the storage node N_PRE increased to an H level in the period t1 changes in accordance with the conducting state of the second transistor 112. Specifically, if the data D1 is at an H level, the second transistor 112 is brought into the conductive state, the potential of the storage node N_PRE increased to an H level decreases to an L level obtained by inverting the data D1. If the data D1 is at an L level, the second transistor 112 is brought into the nonconductive state, the potential of the storage node N_PRE increased to an H level is retained and is at an H level obtained by inverting the data D1. In other words, the storage node N_PRE has the inverted data D1_B obtained by inverting the data D1. The output signal output via the inverter circuit 106 becomes the D1 obtained by inverting the inverted data D1_B.

Next, a description is given of the operation during a supply voltage stop period T_OFF (illustrated in FIG. 3) in which the operation for stopping the supply of the supply voltage and retention of the data D during when the supply of the supply voltage is stopped are performed. The power supply stop period T_OFF can be divided into a period in which the data D and the clock signal CLK are L signals so that the data D4 is stored in the memory node D_HOLD (in FIG. 3, a period t3), and a period in which the supply of the supply voltage is stopped while the data D4 stored in the memory node D_HOLD in the period t3 is retained and the input and output signals are in an indefinite state (in FIG. 3, a period t4).

Note that in the description given with reference to FIG. 3, FIGS. 4A and 4B, FIGS. 5A and 5B, and FIGS. 6A and 6B, a period "X" shown by hatching is included in a period in which the supply of the input and output signals and the supply voltage are stopped, and is a period in an indefinite state in which signal supply based on the supply potential (at an H or L level) is not done.

Figure 5A:
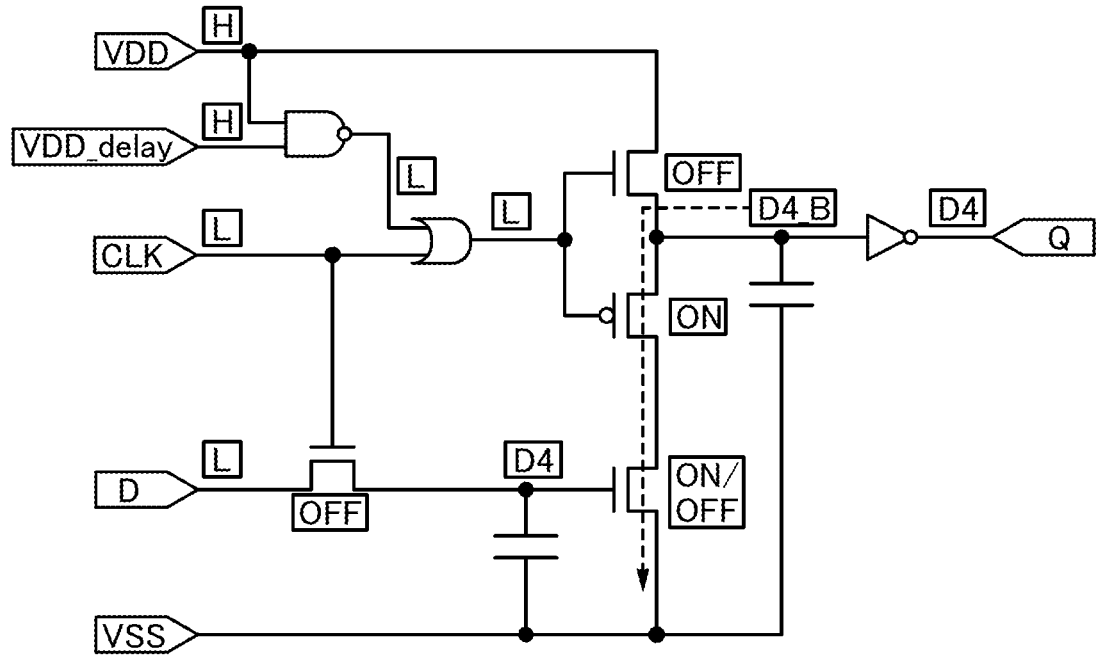
FIGS. 5A and 5B are diagrams for describing the operation of the semiconductor memory device.

FIG. 5A is a diagram illustrating possible conducting states of the transistors in the semiconductor memory device 100 and current flow represented by dotted arrows in the period t3 in the supply voltage stop period T_OFF.

In the period t3, the clock signal CLK and the data D are L signals and the first transistor 111 in the memory circuit 101 is in the nonconductive state. Consequently, even if the data input line D is at an L level, the data D4 written in the previous period is retained in the memory node D_HOLD. At this time, the conducting state of the second transistor 112 depends on the logic state of the data D4, and is represented by "ON/OFF" in the figure.

Further, in the period t3, the first supply potential line VDD and the delay supply potential line VDD_delay are at an H level. Consequently, NAND_OUT is at an L level, while OR_OUT is at an L level. Since OR_OUT is at an L level, the third transistor 114 in the charge storage circuit 103 is brought into the nonconductive state and the fourth transistor 115 in the data detection circuit 104 is brought into the conductive state. As a result, the potential of the storage node N_PRE increased to an H level in the previous period changes in accordance with the conducting state of the second transistor 112. Specifically, if the data D4 is at an H level, the second transistor 112 is brought into the conductive state, the potential of the storage node N_PRE increased to an H level decreases to an L level obtained by inverting the data D4. If the data D4 is at an L level, the second transistor 112 is brought into the nonconductive state, the potential of the storage node N_PRE increased to an H level is retained and is at an H level obtained by inverting the data D4. In other words, the storage node N_PRE has the inverted data D4_B obtained by inverting the data D4. The output signal output via the inverter circuit 106 becomes the data D4 obtained by inverting the inverted data D4_B.

Figure 5B:
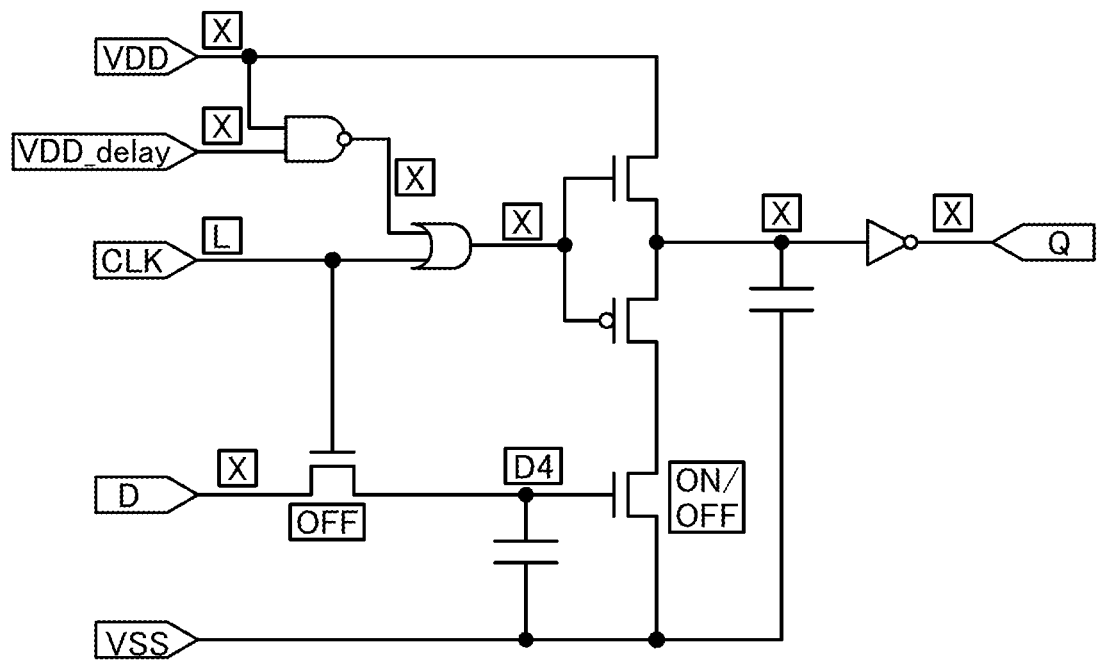

FIG. 5B is a diagram illustrating possible conducting states of the transistors in the semiconductor memory device 100 and current flow represented by dotted arrows in the period t4 in the supply voltage stop period T_OFF.

In the period t4, the clock signal CLK is at an L level, the data D is in the indefinite state, and the first transistor 111 in the memory circuit 101 is in the nonconductive state. Consequently, the data D4 written in the previous period remains retained in the memory node D_HOLD. At this time, the conducting state of the second transistor 112 depends on the logic state of the data D4, and is represented by "ON/OFF" in the figure.

Further, in the period t4, the first supply potential line VDD and the delay supply potential line VDD_delay are in the indefinite state. Consequently, the outputs of the NAND circuit 116 and the OR circuit 117 are brought into the indefinite state. As a result, NAND_OUT and OR_OUT are brought into the indefinite state. Since OR_OUT is in the indefinite state, the third transistor 114 in the charge storage circuit 103 and the fourth transistor 115 in the data detection circuit 104 which have been in the conductive state are brought into the indefinite state. Thus, the potential of the storage node N_PRE is brought into the indefinite state, and the output signal output via the inverter circuit 106 is also brought into the indefinite state.

Next, a description is given of the operation during a second operation period T_ON2 (illustrated in FIG. 3) in which the supply of the supply voltage is restarted and the data D retained while the supply of the supply voltage is stopped is read. The second operation period T_ON2 can be divided into a period in which the clock signal CLK, the first supply potential line VDD, and the delay supply potential line VDD_delay are at an L level, an H level, and an L level, respectively, so that the potential of the storage node N_PRE is at an H level (in FIG. 3, a period t5), and a period in which the data D4 retained in the memory node D_HOLD while the supply of the supply voltage is stopped is output from the output signal line as the output signal Q (in FIG. 3, a period t6).

Figure 6A:
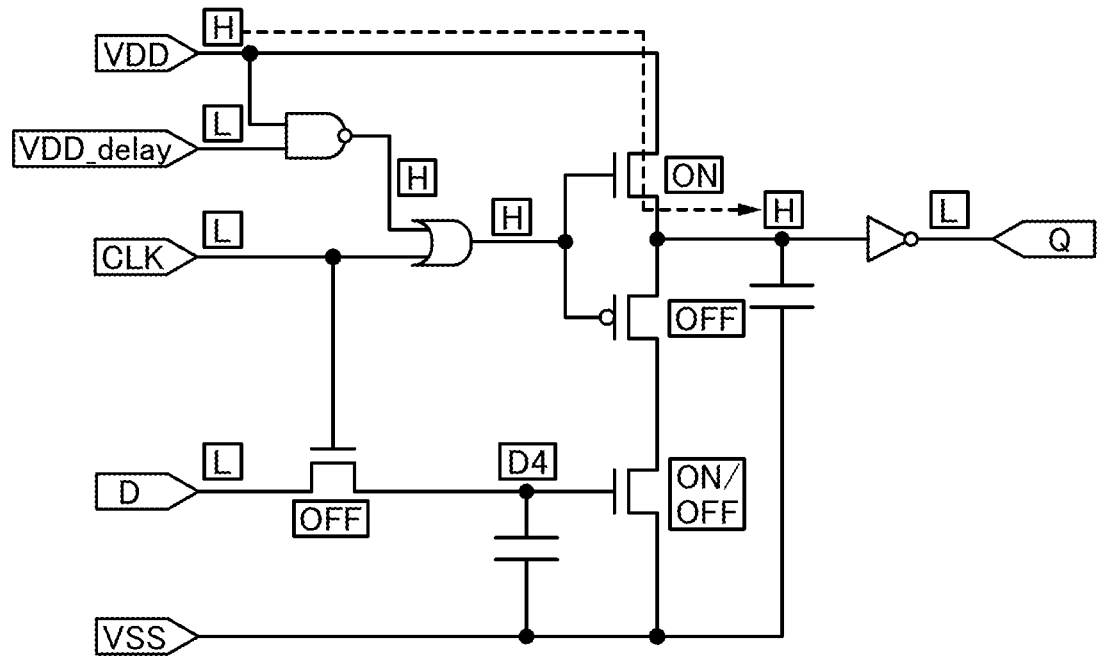
FIGS. 6A and 6B are diagrams for describing the operation of the semiconductor memory device.
Figure 6B:
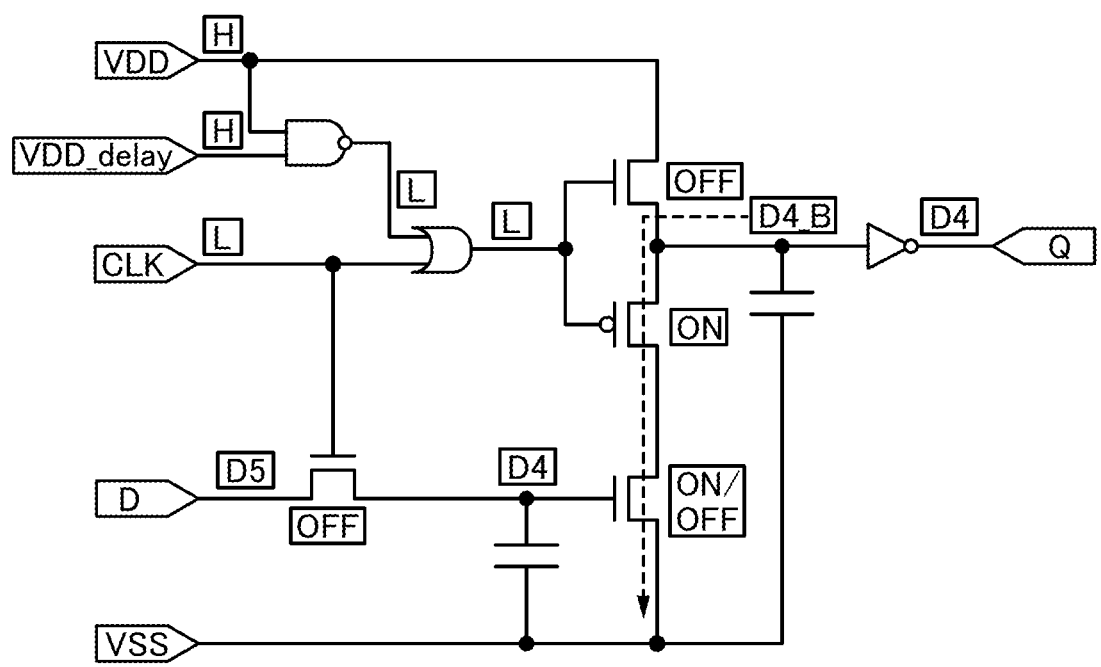

FIG. 6A is a diagram illustrating possible conducting states of the transistors in the semiconductor memory device 100 and current flow represented by dotted arrows in the period t5 in the second operation period T_ON2.

In the period t5, the clock signal CLK and the data D are L signals and the first transistor 111 in the memory circuit 101 is in the nonconductive state. Consequently, even if the data input line D is at an L level, the data D4 written immediately before the supply of the supply voltage is stopped is retained in the memory node D_HOLD. At this time, the conducting state of the second transistor 112 depends on the logic state of the data D4, and is represented by "ON/OFF" in the figure.

Further, in the period t5, the first supply potential line VDD is at an H level, while the delay supply potential line VDD_delay is at an L level. Consequently, NAND_OUT and OR_OUT are H signals. Since OR_OUT is at an H level, the third transistor 114 in the charge storage circuit 103 is brought into the conductive state and the fourth transistor 115 in the data detection circuit 104 is brought into the nonconductive state. As a result, the potential of the storage node N_PRE is increased to an H level by charge storage performed with the charge storage circuit 103. The output signal output via the inverter circuit 106 is at an L level.

FIG. 6A is a diagram illustrating possible conducting states of the transistors in the semiconductor memory device 100 and current flow represented by dotted arrows in the period t6 in the second operation period T_ON2.

In the period t6, the clock signal CLK is at an L level and the first transistor 111 in the memory circuit 101 is in the nonconductive state. Consequently, even if the data input line D has data D5, the data D4 written immediately before the supply of the supply voltage is stopped is retained in the memory node D_HOLD. At this time, the conducting state of the second transistor 112 depends on the logic state of the data D4, and is represented by "ON/OFF" in the figure.

Further, in the period t6, the first supply potential line VDD and the delay supply potential line VDD_delay are at an H level. Consequently, NAND_OUT is at an L level, while OR_OUT is at an L level. Since OR_OUT is at an L level, the third transistor 114 in the charge storage circuit 103 is brought into the nonconductive state and the fourth transistor 115 in the data detection circuit 104 is brought into the conductive state. As a result, the potential of the storage node N_PRE increased to an H level in the period t5 changes in accordance with the conducting state of the second transistor 112. Specifically, if the data D4 is at an H level, the second transistor 112 is brought into the conductive state, the potential of the storage node N_PRE increased to an H level decreases to an L level obtained by inverting the data D4. If the data D4 is at an L level, the second transistor 112 is brought into the nonconductive state, the potential of the storage node N_PRE increased to an H level is retained and is at an H level obtained by inverting the data D4. In other words, the storage node N_PRE has the inverted data D4_B obtained by inverting the data D4. The output signal output via the inverter circuit 106 becomes the data D4 obtained by inverting the inverted data D4_B.

The foregoing has described the operation of the semiconductor memory device 100.

Data can be retained and read in/from a semiconductor memory device which is one embodiment of the present invention before the supply of the supply voltage is stopped and after the supply of the supply voltage is restarted, without separately operating the volatile memory device and the nonvolatile memory device. Moreover, data can be retained and read in/from the semiconductor memory device without control signals for data writing and reading, which reduces the number of signals for controlling the semiconductor memory device.

This embodiment can be implemented in appropriate combination with any of the other embodiments.

Embodiment 2

This embodiment describes a structure using a plurality of semiconductor memory devices 100 described in Embodiment 1.

Figure 7:
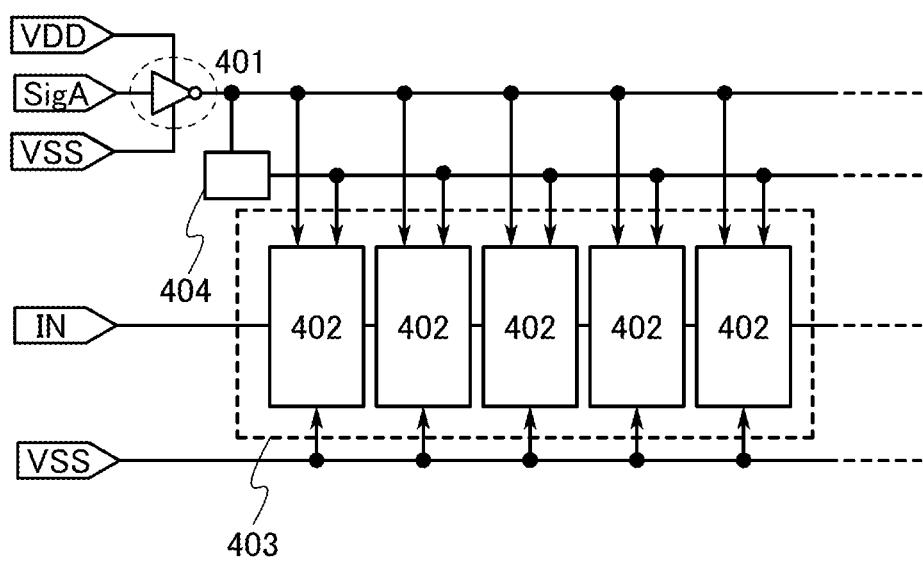
FIG. 7 is a diagram illustrating the structure of the semiconductor memory device.

FIG. 7 illustrates an example of the structure of a semiconductor memory device according to this embodiment. The semiconductor memory device illustrated in FIG. 7 includes an inverter circuit 401 to which the high supply potential VDD and the low supply potential VSS are applied, a semiconductor memory device group 403 including a plurality of semiconductor memory devices 402, and a delay high supply potential generation circuit 404.

The semiconductor memory device 100 described in Embodiment 1 can be used as each semiconductor memory device 402.

To each semiconductor memory device 402 in the semiconductor memory device group 403, the potential switched with the selection signal SigA between the high supply potential VDD and the low supply potential VSS is applied via the inverter circuit 401.

Each semiconductor memory device 402 included in the semiconductor memory device group 403 is connected to the delay high supply potential generation circuit 404 for generating the signal VDD_delay illustrated in FIG. 2.

Further, the potential of a signal IN and the low supply potential VSS are supplied to each semiconductor memory device 402 included in the semiconductor memory device group 403.

The above-described structure allows a plurality of semiconductor memory devices 100 to be supplied with the high supply potential VDD and the signal VDD_delay which is delayed from the high supply potential VDD.

This embodiment can be implemented in appropriate combination with any of the other embodiments.

Embodiment 3

This embodiment describes the structure of a signal processing unit including the semiconductor memory device described in Embodiment 1.

Figure 8:
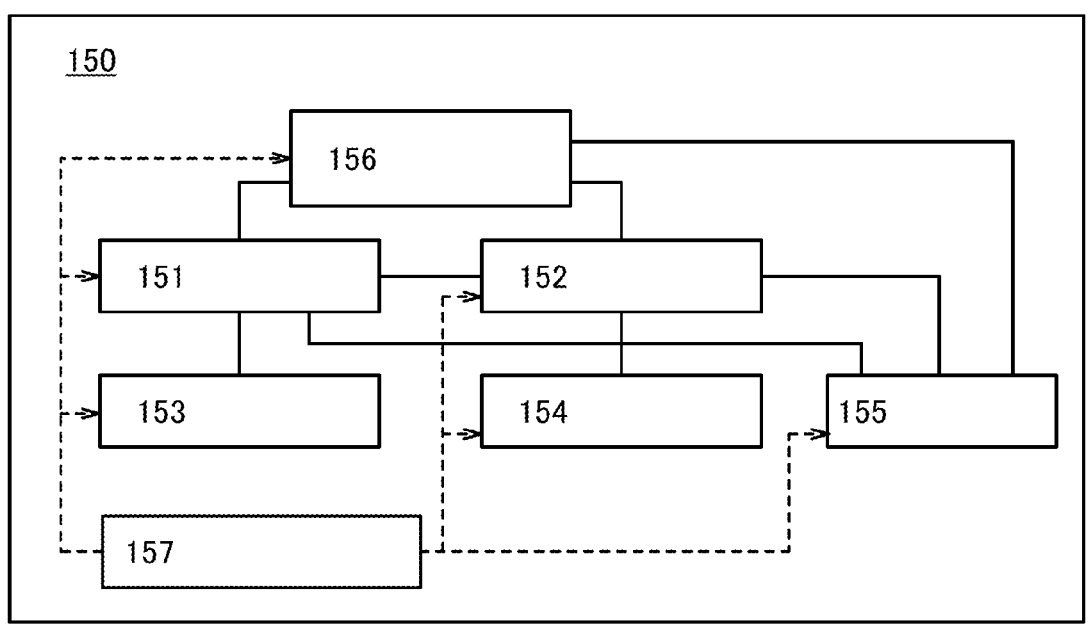
FIG. 8 is a block diagram of a signal processing unit.

FIG. 8 illustrates an example of the signal processing unit according to an embodiment of the present invention. The signal processing unit includes at least one or more arithmetic devices and one or more semiconductor memory devices. Specifically, a signal processing unit 150 illustrated in FIG. 8 includes an arithmetic device 151, an arithmetic device 152, a semiconductor memory device 153, a semiconductor memory device 154, a semiconductor memory device 155, a control device 156, and a power control circuit 157.

The arithmetic devices 151 and 152 each include, as well as a logic circuit which carries out simple logic arithmetic processing, an adder, a multiplier, and various arithmetic devices. The semiconductor memory device 153 functions as a register for temporarily retaining a data signal when the arithmetic processing is carried out in the arithmetic device 151. The semiconductor memory device 154 functions as a register for temporarily retaining a data signal when the arithmetic processing is carried out in the arithmetic device 152.

In addition, the semiconductor memory device 155 can be used as a main memory and can store a program executed by the control device 156 as a data signal or can store a data signal from the arithmetic device 151 and the arithmetic device 152.

The control device 156 is a circuit which collectively controls operations of the arithmetic device 151, the arithmetic device 152, the semiconductor memory device 153, the semiconductor memory device 154, and the semiconductor memory device 155 included in the signal processing unit 150. Note that in FIG. 8, a structure in which the control device 156 is provided in the signal processing unit 150 as a part thereof is illustrated, but the control device 156 may be provided outside the signal processing unit 150.

By using the semiconductor memory device described in Embodiment 1 for the semiconductor memory device 153, the semiconductor memory device 154, and the semiconductor memory device 155, a data signal can be retained without increasing the number of control signals, even when the supply of the supply voltage to the semiconductor memory device 153, the semiconductor memory device 154, and the semiconductor memory device 155 is stopped. Thus, the supply of the supply voltage to the entire signal processing unit 150 is stopped, so that power consumption can be suppressed. Alternatively, the supply of the supply voltage to one or more of the semiconductor memory device 153, the semiconductor memory device 154, and the semiconductor memory device 155 is stopped, so that power consumed by the signal processing unit 150 can be suppressed. After the supply of the supply voltage is restarted, the semiconductor memory device can return to the same state as before the cessation of the supply of the supply voltage in a short time.

The supply of the supply voltage to the control circuit or the arithmetic device which transmits/receives a data signal to/from the semiconductor memory device may be stopped in response to the cessation of the supply of the supply voltage to the semiconductor memory device. For example, when the arithmetic device 151 and the semiconductor memory device 153 do not operate, the supply of the supply voltage to the arithmetic device 151 and the semiconductor memory device 153 may be stopped.

In addition, the power control circuit 157 controls the magnitude of the power supply voltage supplied to the arithmetic device 151, the arithmetic device 152, the semiconductor memory device 153, the semiconductor memory device 154, the semiconductor memory device 155, and the control device 156 included in the signal processing unit 150. In the case where the supply of the supply voltage is stopped, the supply of the supply voltage is stopped either by the power control circuit 157 or by the arithmetic device 151, the arithmetic device 152, the semiconductor memory device 153, the semiconductor memory device 154, the semiconductor memory device 155, and the control device 156.

A semiconductor memory device which functions as a cache memory may be provided between the semiconductor memory device 155 that is a main memory and each of the arithmetic device 151, the arithmetic device 152, and the control device 156. By providing the cache memory, access to the main memory can be reduced and the speed of the signal processing such as arithmetic processing can be higher. By using the above-described semiconductor memory device as a semiconductor memory device functioning as a cache memory, power consumption of the signal processing unit 150 can be suppressed without increasing the number of control signals.

This embodiment can be implemented in appropriate combination with any of the other embodiments.

Embodiment 4

This embodiment describes the configuration of a CPU, which is a type of signal processing units according to one embodiment of the present invention.

Figure 9:
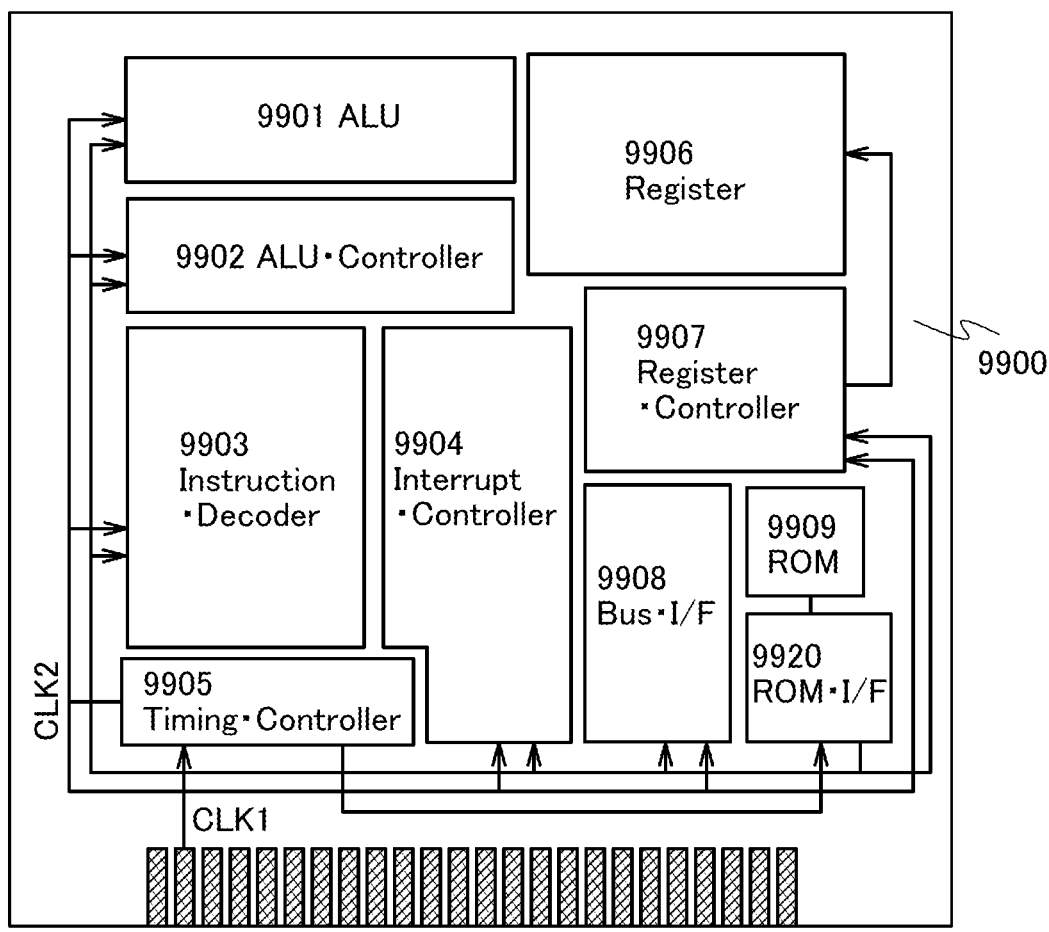
FIG. 9 is a block diagram of a CPU using the semiconductor memory device.

FIG. 9 illustrates the configuration of the CPU according to this embodiment. The CPU illustrated in FIG. 9 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. The ROM 9909 and the ROM I/F 9920 may be provided over different chips. Naturally, the CPU illustrated in FIG. 9 is only an example with a simplified configuration, and an actual CPU may vary in configuration depending on its application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 conduct control operations in accordance with the decoded instruction. Specifically, the ALU controller 9902 generates signals for controlling the drive of the ALU 9901. While the CPU is executing a program, the interrupt controller 9904 determines an interrupt request from an external input/output device or a peripheral circuit on the basis of its priority or a mask state, and processes the request. The register controller 9907 generates an address of the register 9906, and reads/writes a data signal from/to the register 9906 in accordance with the state of the CPU.

The timing controller 9905 generates signals for controlling a drive timing of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU according to this embodiment, a semiconductor memory device having the structure described in any of the above embodiments is provided in the register 9906. In the register controller 9907, the supply of the supply voltage to the semiconductor memory device in the register 9906 can be stopped in accordance with instruction from the ALU 9901 without increasing the number of control signals.

Thus, even in the case where the operation of the CPU is temporarily stopped and the supply of the supply voltage is stopped, a data signal can be held and power consumption can be reduced. Specifically, for example, the operation of the CPU can be stopped while the user of a personal computer does not input a data signal to an input device such as a keyboard, so that the power consumption can be reduced.

Although the example of the CPU is described in this embodiment, the signal processing unit of the present invention is not limited to the CPU and can be used in an LSI such as a microprocessor, an image processing circuit, a digital signal processor (DSP), or a field programmable gate array (FPGA).

This embodiment can be implemented in combination with any of the above embodiments.

Embodiment 5

This embodiment describes a method for manufacturing the semiconductor memory device 100, specifically, the second transistor 112 whose channel is formed in silicon, the first transistor 111 whose channel is formed in an oxide semiconductor layer, and the first capacitor 113 in the memory circuit 101 in FIG. 1B.

Figure 10A:
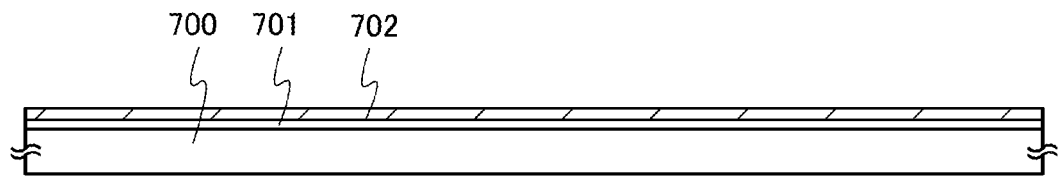
FIGS. 10A to 10D are diagrams illustrating a process for manufacturing the semiconductor memory device.

As illustrated in FIG. 10A, an insulating film 701 and a semiconductor film 702 that has been separated from a single crystal semiconductor substrate are formed over a substrate 700.

Although there is no particular limitation on a material which can be used as the substrate 700, the material needs to have at least heat resistance high enough to withstand the subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is greater than or equal to 730° C. is preferably used as the glass substrate.

Moreover, this embodiment describes a method for forming the second transistor 112, in which the semiconductor film 702 is made of single crystal silicon as an example. A specific example of a method for forming the single crystal semiconductor film 702 is briefly described. First, an ion beam including ions which are accelerated by an electric field enters a bond substrate which is the single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the fragile layer are combined and the microvoids increase in volume. Consequently, a single crystal semiconductor film which is part of the bond substrate is separated from the bond substrate along the embrittlement layer. The heat treatment is performed at temperatures not exceeding the strain point of the substrate 700. Then, the single crystal semiconductor film is processed into a desired shape by etching or the like to form the semiconductor film 702.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Although this embodiment describes the case where a single crystal semiconductor film is used, the present invention is not limited to this. For example, a polycrystalline, microcrystalline, or amorphous semiconductor film which is formed over the insulating film 701 by vapor deposition may be used. Alternatively, the semiconductor film may be crystallized by a known technique. Examples of known crystallization technique include laser crystallization using a laser beam, and crystallization with a catalytic element. Alternatively, crystallization with a catalytic element and laser crystallization may be combined. When a heat-resistant substrate such as a quartz substrate is used, crystallization combined with thermal crystallization with an electrically heated oven, lamp annealing crystallization with infrared light, crystallization with a catalytic element, or high-temperature annealing at approximately 950° C., may be used.

Figure 10B:
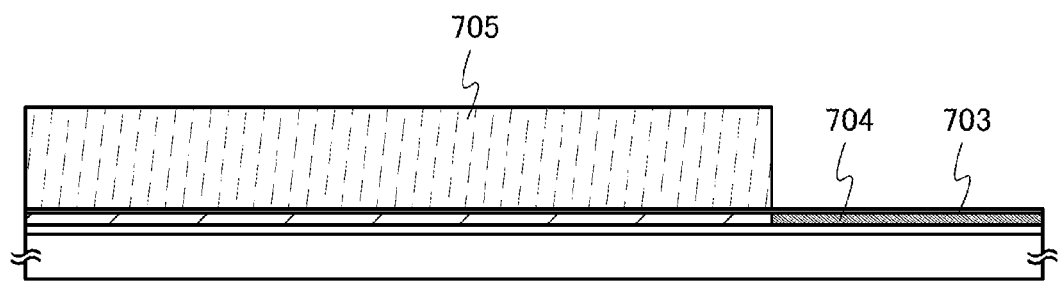

Next, as illustrated in FIG. 10B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, a surface of the semiconductor film 702 is oxidized or nitrided using nitrous oxide ($N_2O$) diluted with Ar by one time to three times (flow ratio) by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variations in thickness between insulating films to be formed can be suppressed. Moreover, in the case where the semiconductor film has crystallinity, the surface of the semiconductor film is oxidized with solid-phase reaction by the high-density plasma treatment to suppress fast oxidation only in a crystal grain boundary; therefore, the gate insulating film with uniformity and low interface state density can be formed. Variations in characteristics between transistors whose gate insulating film partly or entirely includes an insulating film formed by high-density plasma treatment can be suppressed.

The gate insulating film 703 may be a single layer or a stack of layers containing silicon oxide, silicon nitride oxide, silicon oxynitride, silicon nitride, hafnium oxide, aluminum oxide, tantalum oxide, yttrium oxide, hafnium silicate (Hf$Si_xO_y$, (x>0, y>0)), hafnium silicate (Hf$Si_xO_y$, (x>0, y>0)) to which nitrogen is added, hafnium aluminate (Hf$Al_xO_y$, (x>0, y>0)) to which nitrogen is added, or the like by, for example, a plasma CVD method or a sputtering method.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by a plasma CVD method.

Figure 10C:
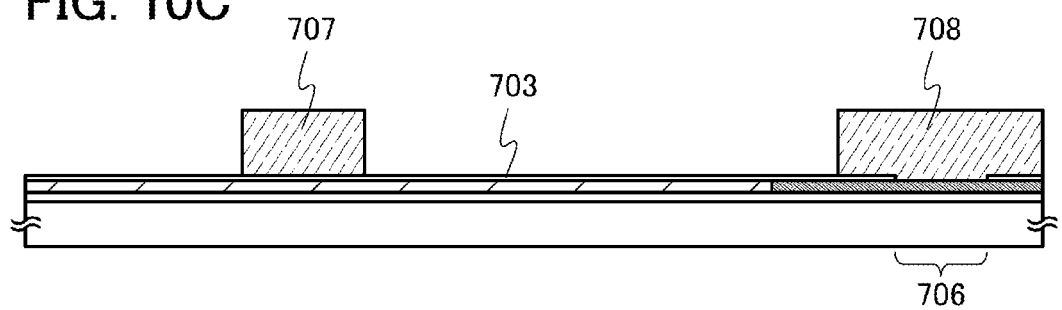

Then, the mask 705 is removed. Subsequently, part of the gate insulating film 703 is removed as illustrated in FIG. 10C and an opening 706 is formed in a region overlapping with the impurity region 704 by etching or the like. After that, a gate electrode 707 and a conductive film 708 are formed.

A conductive film is formed so as to cover the opening 706 and then is processed (patterned) into a predetermined shape, so that the gate electrode 707 and the conductive film 708 can be formed. The conductive film 708 is in contact with the impurity region 704 in the opening 706. The conductive film can be formed by a CVD method, a sputtering method, vapor deposition, spin coating, or the like. The conductive film can be formed using tantalum (Ta), tungsten (W), titanium (Ti), molybdenum (Mo), aluminum (Al), copper (Cu), chromium (Cr), niobium (Nb), or the like. Alternatively, the conductive film may be formed using an alloy mainly of any of these metals, or a compound of any of these metals. Alternatively, the conductive film may be formed using a semiconductor such as polycrystalline silicon doped with an impurity element such as phosphorus which imparts conductivity to the semiconductor film.

Although the gate electrode 707 and the conductive film 708 are formed using a single-layer conductive film in this embodiment, this embodiment is not limited to this structure. The gate electrode 707 and the conductive film 708 may be a stack of a plurality of conductive films.

An example of the combination of two conductive films is a stack of a tantalum nitride or tantalum layer overlaid by a tungsten layer. Other examples include tungsten nitride and tungsten, molybdenum nitride and molybdenum, aluminum and tantalum, and aluminum and titanium. Since tungsten and tantalum nitride have high heat resistance, a heat treatment aimed at thermal activation can be performed in the subsequent steps after the two conductive films are formed. Other examples of the combination of the two conductive films include nickel silicide and silicon doped with an impurity element imparting n-type conductivity, and tungsten silicide and silicon doped with an impurity element imparting n-type conductivity.

In the case where a stack of three conductive films is used, the stack is preferably formed using a molybdenum film, an aluminum film, and a molybdenum film.

The gate electrode 707 and the conductive film 708 can be light-transmitting oxide conductive films of indium oxide, indium oxide and tin oxide, indium oxide and zinc oxide, zinc oxide, zinc aluminum oxide, zinc aluminum oxynitride, zinc gallium oxide, or the like.

Alternatively, the gate electrode 707 and the conductive film 708 may be selectively formed by a droplet discharge method without a mask. A droplet discharge method refers to a method for forming a predetermined pattern by discharge or ejection of a droplet containing a predetermined composition from an orifice, and includes an inkjet method in its category.

In addition, the gate electrode 707 and the conductive film 708 may be formed in such a manner that a conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to be tapered in a desired shape. The taper angle and the like can be adjusted also by the shape of a mask. Note that the etching gas can be, as appropriate, a chlorine-based gas such as chlorine, boron chloride, silicon chloride, or carbon tetrachloride; a fluorine-based gas such as carbon tetrafluoride, sulfur fluoride, or nitrogen fluoride; or oxygen.

In the case where an oxide semiconductor layer 716 is formed by a sputtering method, water and hydrogen in a deposition chamber are made as little as possible in advance. Specifically, it is preferable, for example, to heat the inside of the deposition chamber before deposition, to reduce the concentration of water and/or hydrogen in a gas introduced into the deposition chamber, and to prevent a gas exhausted from the deposition chamber from flowing back into the deposition chamber.

Figure 10D:
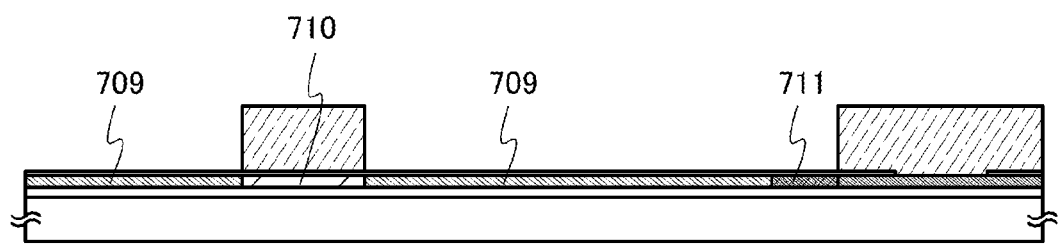

Next, as illustrated in FIG. 10D, when an impurity element imparting one conductivity is added to the semiconductor film 702 with the gate electrode 707 and the conductive film 708 used as masks, a channel formation region 710 overlapping with the gate electrode 707, a pair of impurity regions 709 between which the channel formation region 710 is provided, and an impurity region 711 obtained by further adding an impurity element to part of the impurity region 704 are formed in the semiconductor film 702.

In this embodiment, the case where an impurity element imparting p-type conductivity (e.g., boron) is added to the semiconductor film 702 is described as an example.

Figure 11A:
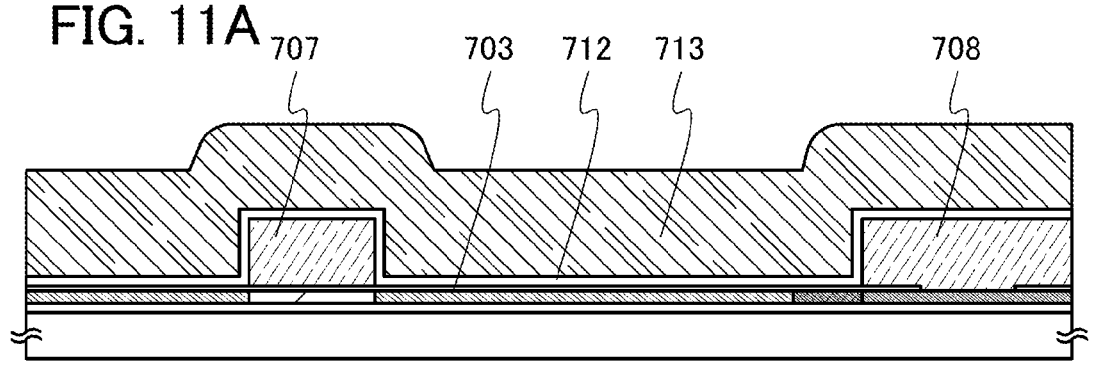
FIGS. 11A to 11C are diagrams illustrating the process for manufacturing the semiconductor memory device.

Next, as illustrated in FIG. 11A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708, in one embodiment of the present invention, only one insulating film may be formed over the gate electrode 707 and the conductive film 708, or three or more insulating layers may be stacked.

Figure 11B:
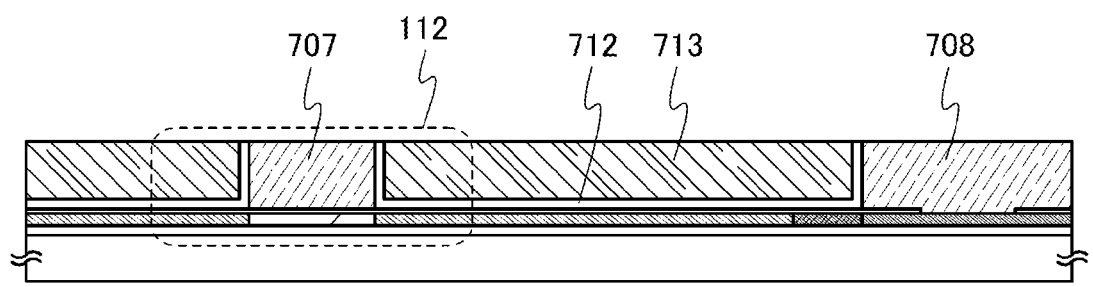

Next, as illustrated in FIG. 11B, the insulating films 712 and 713 are subjected to CMP (chemical mechanical polishing) or etching, so that surfaces of the gate electrode 707 and the conductive film 708 are exposed. Note that in order to improve the characteristics of the first transistor 111 which is formed later, surfaces of the insulating films 712 and 713 are preferably flattened as much as possible.

Through the above process, the second transistor 112 can be formed.

Figure 11C:
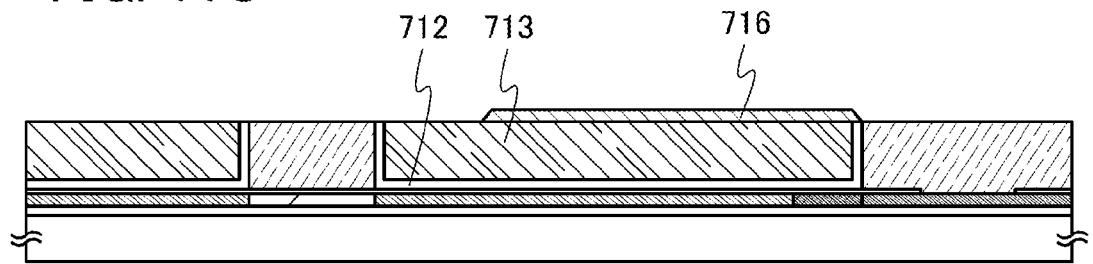

Next, a method for manufacturing the first transistor 111 is described. First, as illustrated in FIG. 11C, the oxide semiconductor layer 716 is formed over the insulating film 712 or the insulating film 713.

The oxide semiconductor layer 716 can be formed by processing an oxide semiconductor film formed over the insulating films 712 and 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm.

The oxide semiconductor film is deposited by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surfaces of the insulating films 712 and 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor film, any of the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a one-component metal oxide such as an In—O-based oxide semiconductor; a Sn—O-based oxide semiconductor; a Zn—O-based oxide semiconductor; and the like.

Note that the use of an In—Sn—Zn—O-based oxide semiconductor for the oxide semiconductor film can increase the mobility of the transistor. Further, the use of an In—Sn—Zn—O-based oxide semiconductor allows the threshold voltage of the transistor to be stably controlled. In the case where an In—Sn—Zn—O-based oxide semiconductor is used, a target may have a composition ratio of In:Sn:Zn=1:2:2, In:Sn:Zn=2:1:3 or In:Sn:Zn=1:1:1 in an atomic ratio, for example.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the target, a target having a composition ratio of In:Ga:Zn=1:1:0.5, In:Ga:Zn=1:1:1, or In:Ga:Zn=1:1:2 can be used, for example. The filling rate of the target including In, Ga, and Zn is higher than or equal to 90% and lower than or equal to 100%, preferably higher than or equal to 95% and lower than 100%. With the use of a target with a high filling factor, a dense oxide semiconductor film is formed.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. at the deposition. By depositing the oxide semiconductor film in a state where the substrate is heated, the concentration of impurities contained in the deposited oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1 \times 10^{-10}$ $Pa \cdot m^3$/second, the entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 is eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be skipped. This preheating may be similarly performed on the substrate 700 over which conductive films 719 and 720 are formed before the deposition of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor layer 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the oxide semiconductor layer 716 to heat treatment, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element contained in an oxide semiconductor, and therefore, is an impurity. Also, alkaline earth metal is impurity in the case where alkaline earth metal is not contained in an oxide semiconductor. Alkali metal, in particular, Na becomes $Na^+$ when an insulating film in contact with the oxide semiconductor layer is an oxide and Na diffuses into the insulating layer. In addition, in the oxide semiconductor layer, Na cuts or enters a bond between metal and oxygen which are contained in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1 \times 10^{18}$ atoms/cm$^3$, preferably less than or equal to $1 \times 10^{17}$ atoms/cm$^3$, the concentration of the above impurity is preferably reduced. Specifically, a measurement value of a Na concentration by secondary ion mass spectrometry is preferably less than or equal to $5 \times 10^{16}$ atoms/cm$^3$, more preferably less than or equal to $1 \times 10^{16}$ atoms/cm$^3$, still more preferably less than or equal to $1 \times 10^{15}$ atoms/cm$^3$. In a similar manner, a measurement value of a Li concentration is preferably less than or equal to $5 \times 10^{15}$ atoms/cm$^3$, more preferably less than or equal to $1 \times 10^{15}$ atoms/cm$^3$. In a similar manner, a measurement value of a K concentration is preferably less than or equal to $5 \times 10^{15}$ atoms/cm$^3$, more preferably less than or equal to $1 \times 10^{15}$ atoms/cm$^3$.

Through the above steps, the concentration of hydrogen in the oxide semiconductor layer 716 can be reduced and the oxide semiconductor layer can be highly purified. Thus, the oxide semiconductor layer can be stabilized. In addition, heat treatment at a temperature lower than or equal to the glass transition temperature makes it possible to form an oxide semiconductor layer with a wide bandgap. Therefore, the transistor can be manufactured using a large-sized substrate, so that the productivity can be increased. The heat treatment can be performed at any time after the oxide semiconductor layer is deposited.

Note that the oxide semiconductor layer may be amorphous or may have crystallinity. For an oxide semiconductor layer having crystallinity, a crystalline oxide semiconductor layer with c-axis orientation (also referred to as c-axis aligned crystalline oxide semiconductor (CAAC-OS)) is preferably used because the effect of improving the reliability of a transistor can be obtained.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where an oxide semiconductor film is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

In a transistor including an oxide semiconductor film composed of CAAC-OS, a change in electric characteristics due to irradiation of visible light or ultraviolet light can be reduced. Consequently, a transistor having stable electric characteristics can be formed.

A CAAC-OS can also be formed by the sputtering method. It is important that, by the sputtering method, hexagonal crystals be formed in the initial stage of deposition of a CAAC-OS film and other crystals grow on the hexagonal crystals serving as seed crystals. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C.

The proportion of oxygen gas in an atmosphere is preferably set high when a CAAC-OS is formed by a sputtering method. For a sputtering method in a mixed gas atmosphere of argon and oxygen, for example, the proportion of oxygen gas is preferably set 30% or higher, more preferably 40% or higher. This is because supply of oxygen from the atmosphere promotes crystallization of the CAAC-OS.

When a CAAC-OS is formed by a sputtering method, a substrate over which a CAAC-OS is deposited is heated preferably to 150° C. or higher, more preferably to 170° C. or higher. This is because a rise in substrate temperature promotes crystallization of the CAAC-OS.

After being subjected to heat treatment in a nitrogen atmosphere or in vacuum, the CAAC-OS is preferably subjected to heat treatment in an oxygen atmosphere or a mixed atmosphere of oxygen and another gas. This is because oxygen deficiency due to the former heat treatment can be compensated by supply of oxygen from the atmosphere in the latter heat treatment.

A film surface where the CAAC-OS (deposition surface) is formed is preferably planar. This is because irregularity of the deposition surface provides grain boundaries in the CAAC-OS because the c-axis substantially perpendicular to the deposition surface exists in the CAAC-OS. For this reason, the deposition surface is preferably subjected to planarization treatment such as chemical mechanical polishing (CMP) before the CAAC-OS is formed. The average roughness of the deposition surface is preferably 0.5 nm or less, more preferably 0.3 nm or less.

The CAAC-OS will be described in detail with reference to FIGS. 14A to 14E, FIGS. 15A to 15C, and FIGS. 16A to 16C. In FIGS. 14A to 14E, FIGS. 15A to 15C, and FIGS. 16A to 16C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 14A to 14E, O surrounded by a circle represents tetracoordinate O and O surrounded by a double circle represents tricoordinate O.

Figure 14A:
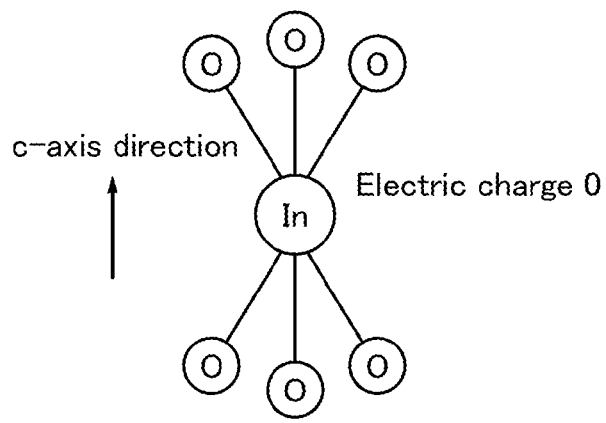
FIGS. 14A to 14E are diagrams illustrating the crystal structure of an oxide material according to one embodiment of the present invention.

FIG. 14A illustrates a structure including one hexacoordinate In atom and six tetracoordinate oxygen (hereinafter referred to as tetracoordinate O) atoms proximate to the In atom. Here, a structure including one In atom and oxygen atoms proximate thereto is referred to as a subunit. The structure in FIG. 14A is actually an octahedral structure, but is illustrated as a planar structure for simplicity. Note that three tetracoordinate O atoms exist in each of an upper half and a lower half in FIG. 14A. In the subunit illustrated in FIG. 14A, electric charge is 0.

Figure 14D:
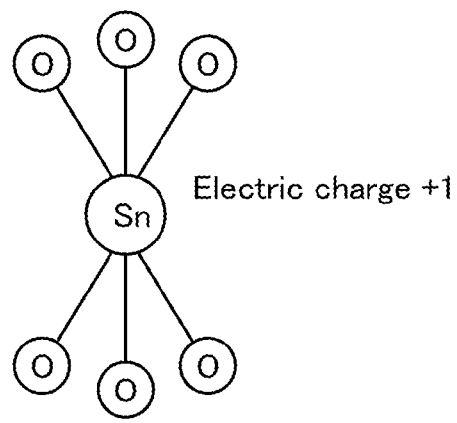
Figure 14B:
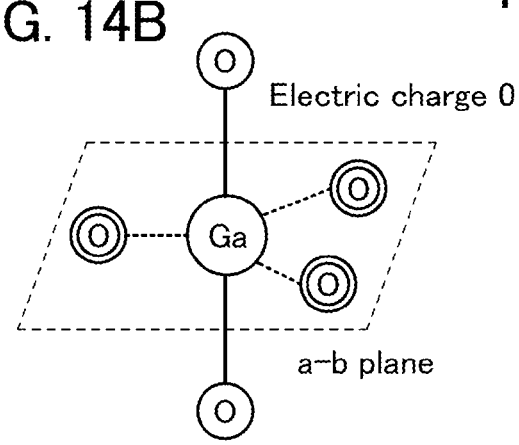

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 14B. An In atom can also have the structure illustrated in FIG. 14B because an In atom can have five ligands. In the subunit illustrated in FIG. 14B, electric charge is 0.

Figure 14E:
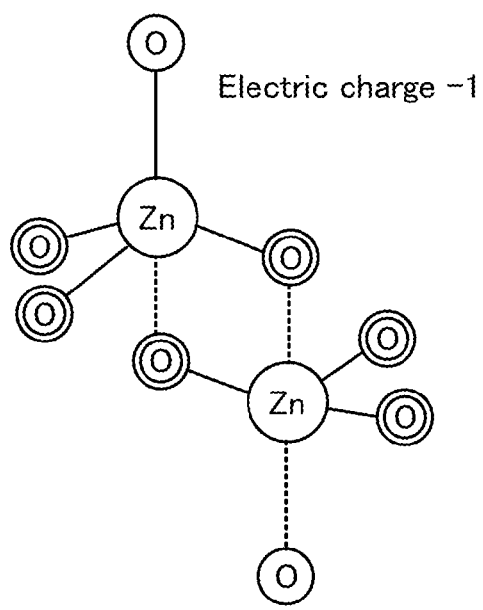
Figure 14C:
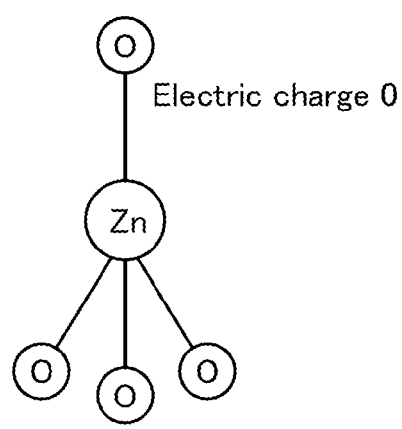

FIG. 14C illustrates a structure including one tetracoordinate Zn atom and four tetracoordinate O atoms proximate to the Zn atom. In FIG. 14C, one tetracoordinate O atom exists in an upper half and three tetracoordinate O atoms exist in a lower half In the subunit illustrated in FIG. 14C, electric charge is 0.

FIG. 14D illustrates a structure including one hexacoordinate Sn atom and six tetracoordinate O atoms proximate to the Sn atom. In FIG. 14D, three tetracoordinate O atoms exist in each of an upper half and a lower half In the subunit illustrated in FIG. 14D, electric charge is +1.

FIG. 14E illustrates a subunit including two Zn atoms. In FIG. 14E, one tetracoordinate O atom exists in each of an upper half and a lower half. In the subunit illustrated in FIG. 14E, electric charge is −1.

Here, a group of some subunits is called one group, and an assembly of a plurality of groups is called one unit.

Now, a rule of bonding between the subunits will be described. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining subunits so that the total electric charge of the layered structure is 0.

Figure 15A:
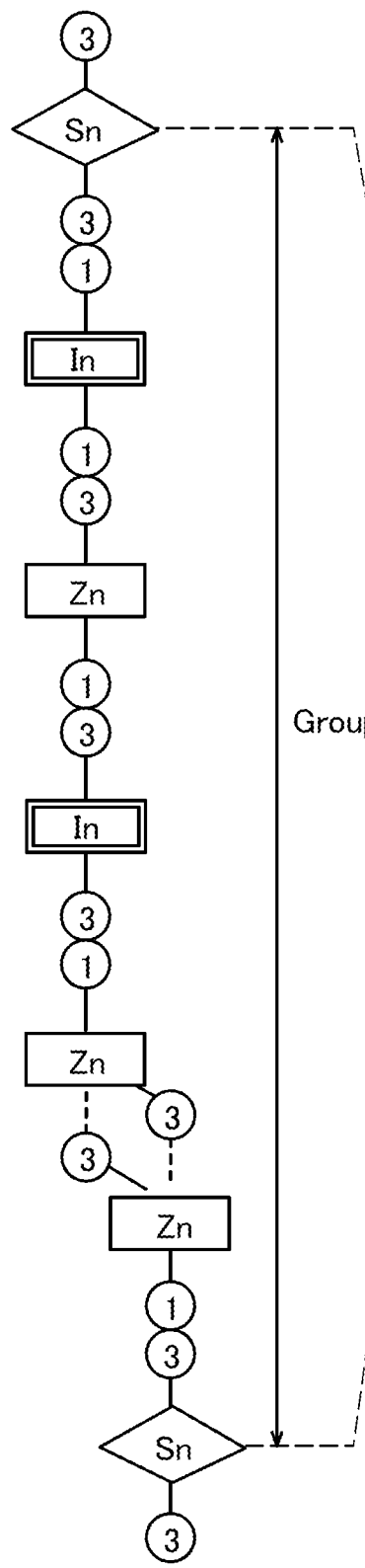
FIGS. 15A to 15C are diagrams illustrating the crystal structure of an oxide material according to one embodiment of the present invention.
Figure 15B:
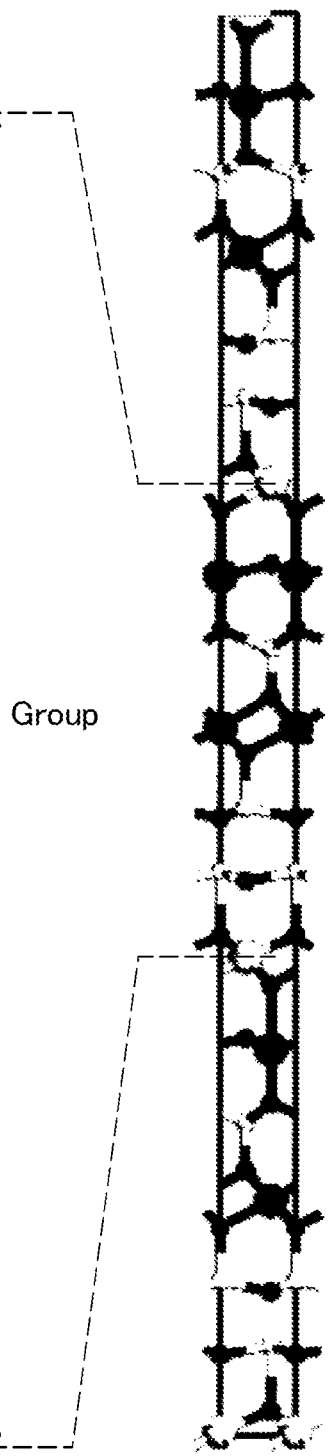
Figure 15C:
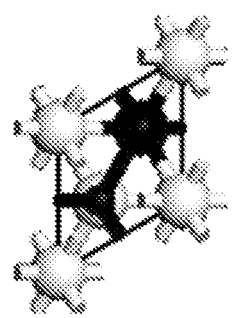

FIG. 15A illustrates a model of one group included in a layered structure of an In—Sn—Zn—O-based material. FIG. 15B illustrates a unit including three groups. Note that FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 15A, one tetracoordinate O atom existing in each of an upper half and a lower half with respect to an In atom is denoted by circled 1.

FIG. 15A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 15A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups bonded to one another forms a unit.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 14E can be given. For example, with one subunit including two Zn atoms, electric charge of one subunit including a Sn atom can be cancelled, so that the total electric charge of the layered structure can be 0.

Specifically, repeated units each of which is illustrated in FIG. 15B can form an In—Sn—Zn—O-based crystal ($In_2SnZn_3O_8$). Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, or a Sn—Al—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 16A:
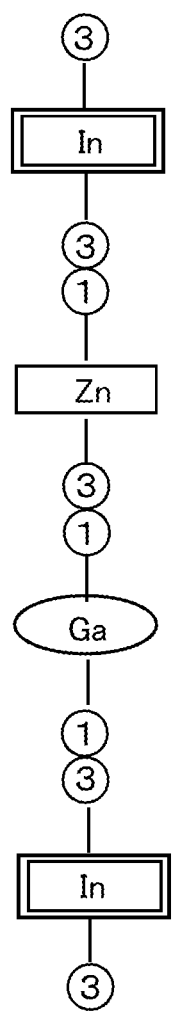
FIGS. 16A to 16C are diagrams illustrating the crystal structure of an oxide material according to one embodiment of the present invention.

As an example, FIG. 16A illustrates a model of one group included in a layered structure of an In—Ga—Zn—O-based material.

In the a group included in the layered structure of the In—Ga—Zn—O-based material in FIG. 16A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups bonded to one another forms a unit.

Figure 16B:
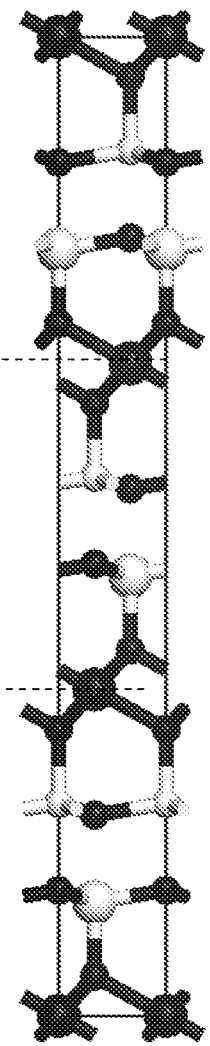
Figure 16C:
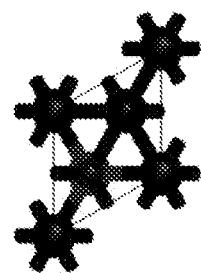

FIG. 16B illustrates a unit including three groups. Note that FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of the group having a combination of such subunits is always 0.

In order to form the layered structure of the In—Ga—Zn—O-based material, a unit can be formed using not only the group illustrated in FIG. 16A but also a unit in which the arrangement of the In atom, the Ga atom, and the Zn atom is different from that in FIG. 16A.

Figure 12A:
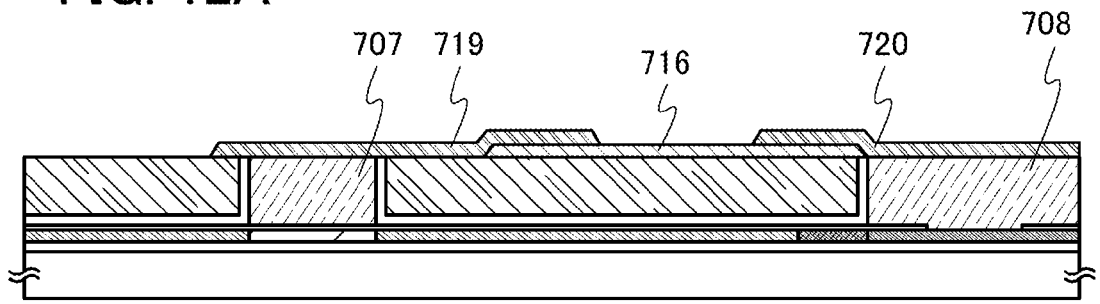
FIGS. 12A to 12C are diagrams illustrating the process for manufacturing the semiconductor memory device.

Then, as illustrated in FIG. 12A, the conductive film 719 which is in contact with the gate electrode 707 and the oxide semiconductor layer 716, and the conductive film 720 which is in contact with the conductive film 708 and the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 and the conductive film 708 by a sputtering method or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film containing silicon; a two-layer structure of an aluminum film and a titanium film stacked thereover; a three-layer structure of a titanium film, an aluminum film stacked thereover, and a titanium film stacked thereover; and the like can be given. A Cu—Mg—Al alloy, a Mo—Ti alloy, Ti, and Mo have high adhesiveness with an oxide film. Therefore, when a layered structure is employed for the conductive films 719 and 720, in which a conductive film containing a Cu—Mg—Al alloy, a Mo—Ti alloy, Ti, or Mo is used for the lower layer and a conductive film containing Cu is used for the upper layer, the adhesion between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide and tin oxide, indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 12B:
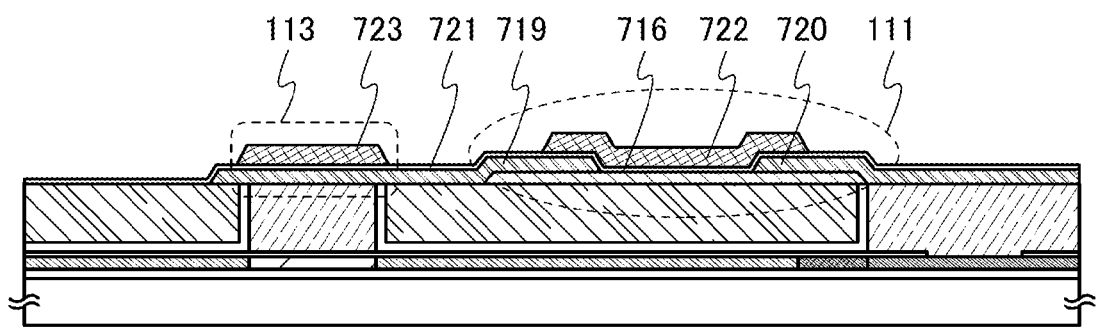

After the plasma treatment, as illustrated in FIG. 12B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably contains impurities such as moisture or hydrogen as little as possible, and the gate insulating film 721 may be formed using a single-layer insulating film or a plurality of stacked insulating films. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, and/or the interface between the oxide semiconductor layer 716 and another insulating film and the vicinity thereof In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by a sputtering method is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. It is preferable that the proportion of oxygen in the oxide semiconductor layer 716 be higher than that in the stoichiometric composition. As a result, the oxide semiconductor layer 716 can be made to be substantially i-type and variations in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially i-type without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is patterned. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the first transistor 111 is formed.

Note that a portion where the conductive film 719 and the conductive film 723 overlap with each other with the gate insulating film 721 provided therebetween corresponds to the first capacitor 113.

Although the first transistor 111 is described as a single-gate transistor, a dual-gate or multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film in contact with the oxide semiconductor layer, an interface with the oxide semiconductor layer can keep a favorable state.

An insulating material containing an element that belongs to Group 13 refers to an insulating material containing one or more elements that belong to Group 13. As the insulating material containing an element that belongs to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material containing gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+a}$ ($0<X<2$, $0<a<1$) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be made to be i-type or substantially i-type.

The oxide semiconductor layer, in which oxygen deficiency has been reduced by supplying excessive oxygen in the insulating film to the oxide semiconductor layer, is a highly purified oxide semiconductor layer in which hydrogen concentration is sufficiently reduced and defect level in the energy gap due to oxygen deficiency is reduced by sufficient supply of oxygen. Consequently, the oxide semiconductor layer carrier can be an oxide semiconductor layer in which carrier concentration is extremely low, which enables the transistor to have an extremely low off-state current. When such a transistor having an extremely low off-state current is used as the first transistor according to the above embodiment, the first transistor can be considered substantially as an insulator when being in the nonconductive state. Therefore, by using such a transistor as the first transistor, a reduction in a potential held at the memory node D_HOLD can be reduced to an extremely low level. As a result, a nonvolatile memory device can be provided in which even if the supply of the supply potential is stopped, a change in the potential at the memory node D_HOLD can be made small, so that stored data can be prevented from being lost.

The insulating film including a region where the proportion of oxygen is higher than that in the stoichiometric composition may be applied to either of the insulating films in contact with the oxide semiconductor layer 716: the insulating film placed on an upper side of the oxide semiconductor layer and the insulating film placed on a lower side of the oxide semiconductor layer; however, it is preferable to apply such an insulating film to both the insulating films in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed of gallium oxide whose composition is $Ga_2O_X$ ($X=3+\alpha$, $0<\alpha<1$). Alternatively, one of the insulating films on the upper side and the lower side may be formed of $Ga_2O_X$ ($X=3+\alpha$, $0<\alpha<1$) and the other may be formed of aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_xAl_{2-x}O_{3+\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 12C:
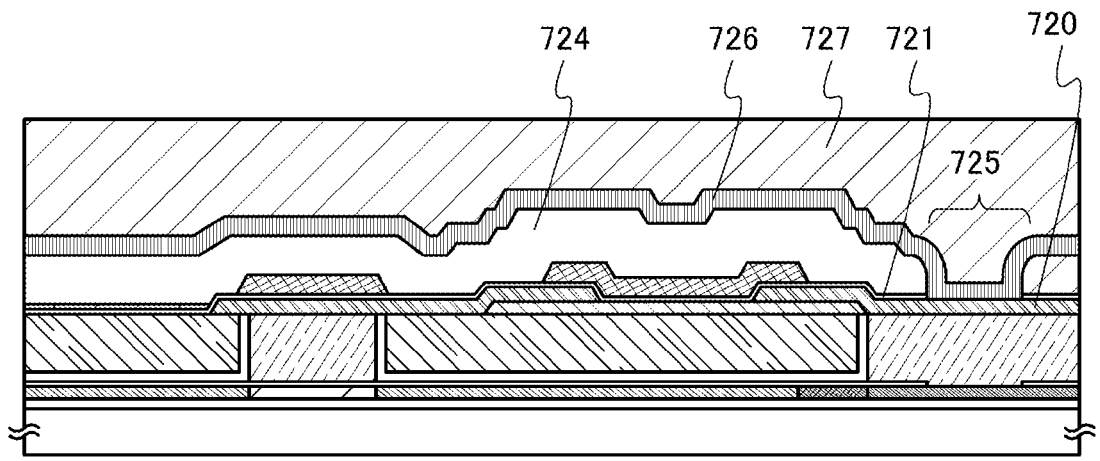

Next, as illustrated in FIG. 12C, an insulating film 724 is formed so as to cover the gate insulating film 721, the conductive film 723, and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by a PVD method or a CVD method and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material containing one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In short, the integration degree of a semiconductor device can be increased.

Next, an insulating film 727 is formed so as to cover the wiring 726. Through the series of steps, the semiconductor memory device can be manufactured.

Note that in the manufacturing method, the conductive films 719 and 720 functioning as source and drain electrodes are formed after the formation of the oxide semiconductor layer 716. Thus, as illustrated in FIG. 12B, in the first transistor 111 obtained by the manufacturing method, the conductive films 719 and 720 are formed over the oxide semiconductor layer 716. However, in the first transistor 111, the conductive films functioning as source and drain electrodes may be formed below the oxide semiconductor layer 716, that is, between the oxide semiconductor layer 716 and the insulating films 712 and 713.

Figure 13:
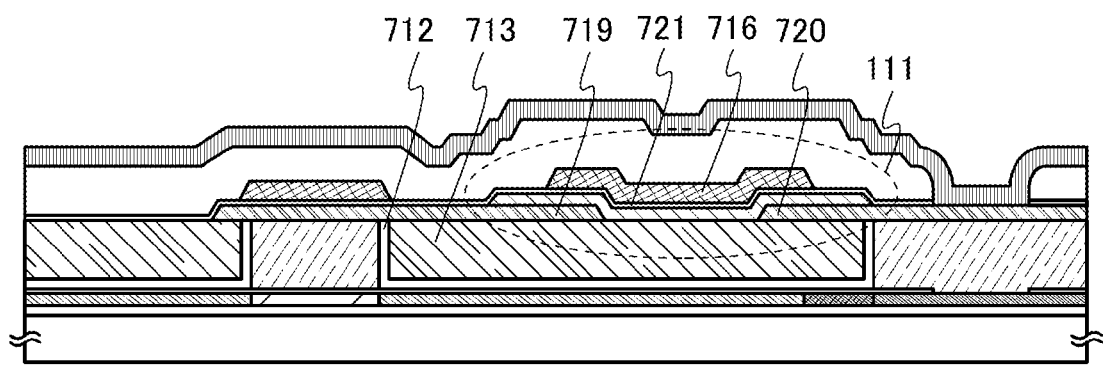
FIG. 13 is a cross-sectional view illustrating the structure of the semiconductor memory device.

FIG. 13 illustrates a cross-sectional view of the first transistor 111 at the time when the conductive films 719 and 720 functioning as source and drain electrodes are provided between the oxide semiconductor layer 716 and the insulating films 712 and 713. The first transistor 111 illustrated in FIG. 13 can be obtained in such a manner that the conductive films 719 and 720 are formed after the formation of the insulating film 713, and then, the oxide semiconductor layer 716 is formed.

A magnetic tunnel junction element (an MTJ element) is generally known as a transistor used in a nonvolatile semiconductor memory device. The MTJ element is put in a low resistance state when the spin directions in films provided above and below an insulating film are parallel, and put in a high resistance state when the spin directions are anti-parallel, thereby storing data. Therefore, the semiconductor memory device including an oxide semiconductor in this embodiment has a principle that is completely different from that of the MTJ element. Table 1 shows comparison between the MTJ element and the semiconductor memory device according to this embodiment.

TABLE 1

|  | Spintronics (MTJ element) | OS/Si |
| --- | --- | --- |
| Heat Resistance | Curie temperature | Process temperature at 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree ($F^2$) | 4 to 15 $F^2$ | Depends on the number of layers stacked in 3D conversion (it is necessary to ensure heat resistance in process of forming upper OS FET) |
| Material | Magnetic rare-earth element | OS material |
| Cost per Bit | High | Low (might be slightly high depending on OS material) |
| Resistance to Magnetic Field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, though the MTJ element requires low write current.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. Further, the material cost per bit of the MTJ element is expensive.

On the other hand, the semiconductor memory device including an oxide semiconductor in this embodiment has an element structure and an operation principle which are similar to those of a silicon MOSFET except that the semiconductor material for the channel is a metal oxide. Further, the semiconductor memory device including an oxide semiconductor is not affected by a magnetic field, and does not cause soft errors. This shows that the transistor is highly compatible with a silicon integrated circuit.

This embodiment can be implemented in appropriate combination with any of the other embodiments.

EXPLANATION OF REFERENCE

100: semiconductor memory device, 101: memory circuit, 102: second capacitor, 103: charge storage circuit, 104: data detection circuit, 105: timing control circuit, 106: inverter circuit, 111: first transistor, 112: second transistor, 113: first capacitor, 114: third transistor, 115: fourth transistor, 116: NAND circuit, 117: OR circuit, 150: signal processing unit, 151: arithmetic device, 152: arithmetic device, 153: semiconductor memory device, 154: semiconductor memory device, 155: semiconductor memory device, 156: control device, 157: power control circuit, 201: delay circuit unit, 202: buffer circuit unit, 203: resistor, 204: capacitor, 205: n-channel transistor, 206: p-channel transistor, 401: inverter circuit, 402: semiconductor memory device, 403: semiconductor memory device group, 404: delay high supply potential generation circuit, 700: substrate, 701: insulating film, 702: semiconductor film, 703: gate insulating film, 704: impurity region, 705: mask, 706: opening, 707: gate electrode, 708: conductive film, 709: impurity region, 710: channel formation region, 711: impurity region, 712: insulating film, 713: insulating film, 716: oxide semiconductor layer, 719: conductive film, 720: conductive film, 721: gate insulating film, 722: gate electrode, 723: conductive film, 724: insulating film, 725: opening, 726: wiring, 727: insulating film, 9900: substrate, 9901: ALU, 9902: ALU controller, 9903: instruction decoder, 9904: interrupt controller, 9905: timing controller, 9906: register, 9907: register controller, 9908: Bus I/F, 9909: ROM, 9920: ROM I/F This application is based on Japanese Patent Application serial no. 2011-103773 filed with Japan Patent Office on May 6, 2011, the entire contents of which are hereby incorporated by reference.

The invention claimed is:

1. A semiconductor memory device comprising:
a memory circuit, the memory circuit comprising:
a first transistor, the first transistor comprising:
a first terminal electrically connected to a data input line;
a second terminal;
a gate electrically connected to a clock signal line; and
a semiconductor layer comprising an oxide semiconductor,
a first capacitor comprising an electrode electrically connected to the second terminal of the first transistor; and
a second transistor comprising a gate electrically connected to the second terminal of the first transistor and to the electrode of the first capacitor,
a second capacitor configured to store electric charge for reading data retained in the memory circuit;
a charge storage circuit electrically connected to a supply potential line, the charge storage circuit controlling storage of electric charge in the second capacitor;
a data detection circuit configured to control conduction or non-conduction between an electrode of the second capacitor and a first terminal of the second transistor,
a timing control circuit configured to cause the charge storage circuit and the data detection circuit to be alternately brought into a conductive state in accordance with toggling of a clock signal in a first period in which the clock signal is supplied to the clock signal line, and to generate a first signal that controls storage of electric charge in the second capacitor, the storage being conducted with the charge storage circuit, the first signal being generated with a second signal at a supply voltage and a third signal delayed from the second signal at the supply voltage in a second period immediately after the supply voltage is supplied to the supply potential line; and
an inverter circuit configured to output a potential obtained by inverting a potential of the electrode of the second capacitor.

2. The semiconductor memory device according to claim 1, wherein the second transistor comprises silicon in a semiconductor layer.

3. The semiconductor memory device according to claim 2, wherein the first transistor and the second transistor are stacked each other.

4. The semiconductor memory device according to claim 1, wherein the data detection circuit is a circuit configured to convert a potential of the electrode of the second capacitor into an inverted data signal having inverted data in accordance with discharge and non-discharge of the electric charge stored in the second capacitor, the discharge and non-discharge being determined by a conducting state of the second transistor.

5. The semiconductor memory device according to claim 1, wherein a circuit for delaying the signal at the supply potential comprises a delay circuit and a buffer circuit.

6. The semiconductor memory device according to claim 1, wherein the timing control circuit comprises a non-conjunction circuit receiving a signal at the supply potential and a signal delayed from the signal at the supply potential, and a disjunction circuit receiving an output signal of the non-conjunction circuit and the clock signal.

7. A semiconductor memory device comprising:
a memory circuit, the memory circuit comprising:
a first transistor, the first transistor comprising:
a first terminal electrically connected to a data input line;
a second terminal;
a gate electrically connected to a clock signal line; and
a semiconductor layer comprising an oxide semiconductor,
a first capacitor comprising an electrode electrically connected to the second terminal of the first transistor; and
a second transistor comprising a gate electrically connected to the second terminal of the first transistor and to the electrode of the first capacitor,
a second capacitor configured to store electric charge for reading data retained in the memory circuit;
a charge storage circuit comprising a third transistor comprising a first terminal electrically connected to a supply potential line and a second terminal electrically connected to an electrode of the second capacitor;
a data detection circuit comprising a fourth transistor comprising a first terminal electrically connected to the electrode of the second capacitor and a second terminal electrically connected to a first terminal of the second transistor;
a timing control circuit configured to cause the third transistor and the fourth transistor to be alternately brought into a conductive state in accordance with toggling of the clock signal in a first period in which the clock signal is supplied to the clock signal line, and to generate a first signal for bringing the third transistor into a conductive state, the first signal being generated with a second signal at a supply voltage and a third signal delayed from the second signal at the supply voltage in a second period immediately after the supply voltage is supplied to the supply potential line; and an inverter circuit configured to output a potential obtained by inverting a potential of the electrode of the second capacitor.

8. The semiconductor memory device according to claim 7, wherein the second transistor comprises silicon in a semiconductor layer.

9. The semiconductor memory device according to claim 8, wherein the first transistor and the second transistor are stacked each other.

10. The semiconductor memory device according to claim 7, wherein the data detection circuit is a circuit configured to convert a potential of the electrode of the second capacitor into an inverted data signal having inverted data in accordance with discharge and non-discharge of the electric charge stored in the second capacitor, the discharge and non-discharge being determined by a conducting state of the second transistor.

11. The semiconductor memory device according to claim 7, wherein a circuit for delaying the signal at the supply potential comprises a delay circuit and a buffer circuit.

12. The semiconductor memory device according to claim 7, wherein the timing control circuit comprises a non-conjunction circuit receiving a signal at the supply potential and a signal delayed from the signal at the supply potential, and a disjunction circuit receiving an output signal of the non-conjunction circuit and the clock signal.

13. A semiconductor memory device comprising:
a memory circuit, the memory circuit comprising:
a first transistor, the first transistor comprising:
a first terminal electrically connected to a data input line;
a second terminal;
a gate electrically connected to a clock signal line; and
a semiconductor layer comprising an oxide semiconductor,
a first capacitor comprising an electrode electrically connected to the second terminal of the first transistor; and
a second transistor comprising a gate electrically connected to the second terminal of the first transistor;
a second capacitor;
a third transistor comprising a first terminal electrically connected to a supply potential line and a second terminal electrically connected to an electrode of the second capacitor;
a fourth transistor comprising a first terminal electrically connected to the electrode of the second capacitor and a second terminal electrically connected to a first terminal of the second transistor;
a timing control circuit electrically connected to the gate of the first transistor, a gate of the third transistor, a gate of the fourth transistor, the supply potential line, and a delay supply potential line; and
an inverter circuit electrically connected to the electrode of the second capacitor.

14. The semiconductor memory device according to claim 13,
wherein the clock signal line supplies a clock signal,
wherein the supply potential line supplies a supply voltage,
wherein the delay supply potential line supplies a delay supply potential signal, and
wherein the timing control circuit is configured to control the third transistor and the fourth transistor in accordance with the clock signal, the supply voltage, and the delay supply potential signal.

15. The semiconductor memory device according to claim 13, wherein the second transistor comprises silicon in a semiconductor layer.

16. The semiconductor memory device according to claim 14, wherein the first transistor and the second transistor are stacked each other.

17. The semiconductor memory device according to claim 13, further comprising a circuit comprising a delay circuit and a buffer circuit,
wherein the circuit is electrically connected to the delay supply potential line.

* * * * *